(12) United States Patent
Hurri et al.

(10) Patent No.: US 9,322,668 B2
(45) Date of Patent: Apr. 26, 2016

(54) SMARTGRID ENERGY-USAGE-DATA STORAGE AND PRESENTATION SYSTEMS, DEVICES, PROTOCOL, AND PROCESSES

(75) Inventors: Pasi Hurri, Degerby (FI); Niilo Neuvo, Espoo (FI); Topi Mikkola, Vantaa (FI); Erik Bunn, Basel (CH); Ilkka Kaakkola, Helsinki (FI); Kalle Kivimaa, Vantaa (FI)

(73) Assignee: BaseN Corporation, Helsinki (FI)

( * ) Notice: Subject to any disclaimer, the term of this patent is extended or adjusted under 35 U.S.C. 154(b) by 527 days.

(21) Appl. No.: 13/328,952

(22) Filed: Dec. 16, 2011

(65) Prior Publication Data

US 2012/0158327 A1 Jun. 21, 2012

(51) Int. Cl.
| | |
|---|---|
| *G06F 19/00* | (2011.01) |
| *G01R 21/00* | (2006.01) |
| *G01D 4/00* | (2006.01) |
| *G06Q 50/06* | (2012.01) |
| *G06Q 50/10* | (2012.01) |

(52) U.S. Cl.
CPC ............... *G01D 4/002* (2013.01); *G06Q 50/06* (2013.01); *G06Q 50/10* (2013.01); *Y02B 90/241* (2013.01); *Y04S 10/60* (2013.01); *Y04S 20/30* (2013.01); *Y04S 20/32* (2013.01)

(58) Field of Classification Search
CPC ........ G06Q 50/06; G06Q 50/10; G06F 19/00; G01R 21/00; Y02B 90/241; Y04S 10/60; Y04S 10/14; Y04S 20/18; Y04S 20/32; Y04S 20/30
USPC .......................................................... 702/62
See application file for complete search history.

(56) References Cited

U.S. PATENT DOCUMENTS 6,327,541 B1 * 12/2001 Pitchford et al. ................ 702/62
2009/0040029 A1 * 2/2009 Bridges et al. ........... 340/310.11

OTHER PUBLICATIONS

Mikkola et al., Near real time energy monitoring for end users:requirements and sample applications. IEEE, Oct. 17, 2011.*
Ari et al., "Kotien reaaliaikainen sähkönkulutuksen mittaaminen ja havainnollistaminen—HEAT'07 projektin tulokset," Suomen ympäristökeskuksen raportteja Jul. 2008.
Mikkola et al., "Public Summary of Sensing Infrastructure," D3.7 v 1.0, (2010). Available at http://www.energyawareness.eu/beaware/wp-content/uploads/2010/07/Beaware-D3.7-BASEN-V1.0.pdf.
Spagnolli et al, "D2.1 Users' Practices and Requirements," (2009). Available at http://www.energyawareness.eu/beaware/uploads/deliverables/BeAware-D2.1-UNIPD-20081031.pdf.
Stockholm Royal Seaport, Retrieved from the Internet on Nov. 4, 2011: http://www.stockholmroyalseaport.com/.
Similä et al.,"Energianäytöt uutena sähkön kuluttajapalautteen muotona," (2010). Available at http://www.ece.hut.fi/enete/VTT_ENETE_Energianaytot_220910.pdf.
Fischer, "Feedback on Household Electricity Consumption: A Tool for Saving Energy?," Energy Efficiency, (2008). Available http://www.springerlink.com/content/276m42024x61wh1h/.

(Continued)

*Primary Examiner* — John Breene
*Assistant Examiner* — Lynda Dinh
(74) *Attorney, Agent, or Firm* — Sukovic Law PC; Milena Sukovic

(57) ABSTRACT

This disclosure relates to systems, devices, protocols, and processes for retrieving, accessing, and presenting information of energy usage using a distributed storage process and distributed logical services to provide a user with real-time energy usage information and visualization.

24 Claims, 22 Drawing Sheets

(56) References Cited

OTHER PUBLICATIONS

Spagnolli et al., "Eco-Feedback on the Go: Motivating Energy Awareness," Computer, pp. 38-45, (2011).
Jacucci et al., "Designing Effective Feedback of Electricity Consumption for Mobile User Interfaces," PsychNology Journal, vol. 7, No. 3, pp. 265-289, (2009).
Root Cause Analysis, Retrieved from the Internet on Nov. 14, 2011: https://secure.wikimedia.org/wikipedia/en/wiki/Root_cause_analysis.
Fitta et al., "Exploring Techniques for Monitoring Electric Power Consumption in Households," The Fourth International Conference on Mobile Ubiquitous Computing, Systems, Services and Technologies, UBICOMM 2010, Florence, Italy, Oct. 2010.
Björkskog et al., "EnergyLife: Pervasive Energy Awareness for Households," UbiComp'10, pp. 361-362, Sep. 2010.
Koivisto, "Tuntimittausdatan käyttö sähkökuorman ennustamisessa," Department of Electrical Engineering Aalto University, School of Science & Technology Espoo, Finland, 2010, Master's Thesis.
Pacific Gas and Electric Company SmartMeter Program, Advanced Metering Infrastructure Initiative, pp. 1-667. Available at http://www.pge.com/includes/docs/pdfs/myhome/customerservice/meter/smartmeter/smartmetercpucreport_051010.pdf.
Directive 2006/32/EC of the European Parliament and of the Council of Apr. 5, 2006 on energy end-use efficiency and energy services and repealing Council Directive 93/76/EEC. Available at http://eur-lex.europa.eu/LexUriServ/LexUriServ.do?uri=CELEX:32006L0032:EN:NOT.
Gunther et al., "Smart Grid Standards Assessment and Recommendations for Adoption and Development (draft 0.83)," EnerNex Corporation, Feb. 2009. Available at http://osgug.ucaiug.org/Shared%20Documents/Forms/AllItems.aspx.
Gunther, "An Overview of Smart Grid Standards," EnerNex Corporation, Feb. 2009.
Torcellini et al., "Zero Energy Buildings: A Critical Look at the Definition," NREL/CP-550-39833, ACEEE Summer Study, Aug. 2006.
Steinbock et al., "Net Zero Energy Building Case Study: Science House," ASHRAE Transactions, vol. 113, Issue 1, pp. 26-35, (2007).
Noguchi et al., "Net Zero Energy Homes of the Future: A Case Study of the ÉcoTerra™ House in Canada," Presented at the Renewable Energy Congress, Scotland, Jul. 2008. Available at http://cetc-ctec.nrcan-rncan.gc.ca/fichier.php/codectec/En/2008-112/2008-112_OP-J_411-PVTZEH_EcoTerra.pdf.
Siddiqui et al., "Utilization of Thermal Mass in the Toronto Net Zero Energy House for Thermal Comfort and Energy Savings," Department of Mechanical and Industrial Engineering, Ryerson University, Toronto, Canada; in the Eleventh International IBPSA Conference (2009).
Hashiguchi et al., "Physiological and Subjective Responses in the Elderly When Using Floor Heating and Air Conditioning Systems," Journal of Physiological Anthropology and Applied Human Science, vol. 23, pp. 205-213, (2004).
Steinhart et al., "Calibration Curves for Thermistors," Deep-Sea Research and Oceanographic Abstracts, vol. 15, Issue 4, pp. 497-503, Aug. 1968.
Darby, "The Effectiveness of Feedback on Energy Consumption," Environmental Change Institute University of Oxford, Apr. 2006.
Berges et al., "Training Load Monitoring Algorithms on Highly Sub-Metered Home Electricity Consumption Data," Tsinghua Science and Technology, vol. 13, No. S1, pp. 406-411, Oct. 2008.

\* cited by examiner

SMARTGRID ENERGY-USAGE-DATA STORAGE AND PRESENTATION SYSTEMS, DEVICES, PROTOCOL, AND PROCESSES

CROSS-REFERENCE TO RELATED APPLICATIONS

This disclosure relates to the following filed applications titled:

SMARTGRID ENERGY-USAGE-DATA STORAGE AND PRESENTATION SYSTEMS DEVICES, PROTOCOL, AND PROCESSES INCLUDING A STORAGE DISTRIBUTION PROCESS;

SMARTGRID ENERGY-USAGE-DATA STORAGE AND PRESENTATION SYSTEMS, DEVICES, PROTOCOL, AND PROCESSES INCLUDING A STORAGE DISTRIBUTION PROCESS AND PROTOCOL;

SMARTGRID ENERGY-USAGE-DATA STORAGE AND PRESENTATION SYSTEMS, DEVICES, PROTOCOL, AND PROCESSES INCLUDING AN ANNOUNCEMENT PROTOCOL;

SMARTGRID ENERGY-USAGE-DATA STORAGE AND PRESENTATION SYSTEMS, DEVICES, PROTOCOL, AND PROCESSES INCLUDING A VISUALIZATION, AND LOAD FINGERPRINTING PROCESS.

The above-identified patent applications are assigned to the same entity, and con-currently filed with this application. The entire disclosures of all of the above-referenced applications are hereby incorporated by reference herein.

FIELD OF TECHNOLOGY

This disclosure relates to systems, devices, protocols, and processes for collecting, storing, accessing, and presenting information of energy usage in real-time throughout a smart grid energy system.

DESCRIPTION OF THE BACKGROUND ART

An energy providing entity typically employs a worker to physically go out to a customer's geographical location to visually read an energy meter to determine the amount of electricity that was supplied to a residential unit (i.e., customer unit). The energy provider is not able to obtain or provide further information about which devices inside the residential unit used how much energy. Typically, when determining the energy bill for a commercial unit, the energy provider estimates the total consumption of electricity for commercial unit (i.e., customer unit) by estimating the usage per customer unit based on an overall measurement of the energy usage in the greater geographical area that includes that customer unit.

An example of an energy provider that uses the above methods to establish energy usage for charging their customers is Pacific Gas and Electric Company in California, which supplies energy to about 13 million customer units. With the existing energy monitoring methods there is no good way for the energy provider or customer to obtain actual energy consumption information, such as more exact or more granular energy usage information. More granular data about actual energy consumption may be useful to the energy customers to help them determine how to reduce their energy costs and hoe to conserve energy.

The present way customers receive feedback on their energy usage is through a monthly bill that their energy provider sends them. The bill does not break down the total amount of energy consumption into a more granular form. The information a customer receives from a monthly total energy consumption bill is not timely or detailed enough to provide energy usage feedback that would enable a customer to adjust their individual energy consumption or pinpoint possible problems with their energy consumption devices.

Energy providers do not have the ability to effectively provide more granular information with their current electrical grid systems. Current electrical energy grid systems are a collection of transmission lines, substations, and transformers that deliver electricity from a power plant to a customer unit. Besides the electrical grid systems not being capable of obtaining more exact or more granular usage information, these systems are not able to effectively scale or extend to provide communications with newly implemented energy usage monitoring devices. These systems are also not able to provide energy usage information in real-time. These systems are also not able to process the large amounts of information that would be received from a large customer base, if for example the information received were to come from millions of customers that have multiple electrical monitoring devices inside their current energy consumption customer units. The existing systems are also not able to provide access to data or presentation of the usage data that would be associated with the usage of those electrical monitoring devices in real-time.

SUMMARY OF THE DISCLOSURE

An energy usage data storage system including a first sensor device; a plurality of redundant agent devices each configured to receive energy usage data from the first sensor device and transfer the energy usage data to a plurality of redundant logger devices; the plurality of redundant logger devices each configured to forward the energy usage data to a plurality of redundant storage devices; the plurality of redundant storage devices configured to store the energy usage data as raw data.

An process of storing energy usage data in real time comprising: obtaining raw energy usage data, with a first sensor device, as it becomes available in real time; receiving the raw energy usage data from the first sensor device; transferring the raw energy usage data to a plurality of redundant logger devices; transferring the raw energy usage data to a plurality of redundant storage devices; storing the raw energy usage data as raw data including any one of: an integer number that represents an increasing pulse counter, a voltage value, a current value, power data, harmonic data, external temperature, internal temperature, or a pump state; or any form that the data was received from the sensor device.

An energy usage data storage distribution process comprising: receiving energy usage information data and an associated origination information data at a logger device; determining to which plurality of storage units to distribute the energy usage information, based on the origination information data; wherein each storage unit is part of a respective group of storage units.

An energy usage data storage distribution system comprising: a logger device configured to receive energy usage information data and an associated origination information data at a logger device; the logger device configured to determine to which plurality of storage units to distribute the energy usage information, based on the origination information data; wherein each storage unit is part of a respective group of storage units.

A real-time energy usage data storage distribution process comprising: receiving energy usage information and an associated origination information data at a logger device; determining to which plurality of storage units, each storage unit from a respective group of storage units, to distribute and store the energy usage information, based on the origination information data; wherein the logger device performs a spreading algorithm on the origination information data when determining to which long-term storage device from the respective group of storage devices should the energy usage data be distributed and stored.

A logger device comprising: a processor, a transmitter; a receiver; an I/O device; a memory; a module stored in the memory and configured to be executed by the processor to: receive energy usage information and an associated origination information data at a logger device; determine to which plurality of storage units, each storage unit from a respective group of storage units, to distribute and store the energy usage information, based on the origination information data; wherein the logger device performs a spreading algorithm on the origination information data when determining to which long-term storage device from the respective group of storage devices should the energy usage data be distributed and stored.

A distributed architecture service announcement protocol process comprising: transmitting a multicast or broadcast type announcement message to a plurality of redundant service modules of a distributed energy usage data storage distribution system; wherein the announcement message includes a service indication.

A distributed architecture service announcement protocol process comprising: transmitting a multicast or broadcast type announcement message to a plurality of redundant service modules of a distributed energy usage data storage distribution and presentation system; wherein the announcement message includes a service indication for each of: a logger service, a storage unit service, an event monitoring and alerting service, search engine service, visualization service, data filtering service, autodiscovery service, issue correlation service, report manager service, user management service, map tile service, content manager service, insite map service, issue manager service, report manager service, customer portal service, end-user portal service, data export service, interface service.

A distributed architecture service device configured to provide any one of the following group of services: logger service, storage unit service, event monitoring and alerting service, search engine service, visualization service, data filtering service, autodiscovery service, issue correlation service, report manager service, user management service, map tile service, content manager service, insite map service, issue manager service, report manager service, customer portal service, end-user portal service, data export service, interface service; the service device comprising: a processor, a transmitter; a receiver; an I/O device; a memory; a module stored in the memory and configured to be executed by the processor to: monitor for a multicast or broadcast type announcement message including a service type indication for any one of the group of services for which the service device requires; store information from the received announcement message.

A logger device comprising: a processor, a transmitter; a receiver; an I/O device; a memory; a module stored in the memory and configured to be executed by the processor to: monitor for a multicast or broadcast type announcement message including a service type indication for any one of the following group of services: logger service, storage unit service, event monitoring and alerting service, search engine service, visualization service, data filtering service, autodiscovery service, issue correlation service, report manager service, user management service, map tile service, content manager service, insite map service, issue manager service, report manager service, customer portal service, end-user portal service, data export service, interface service; for which the logger device requires; store information from the received announcement message in the memory in a service list or service table.

An energy usage data visualization process comprising: obtaining energy usage data in a raw data form from a storage device, based on originator information associated with the raw energy usage data; presenting the raw energy usage data based on one or more filter settings.

An energy monitoring and data visualization system comprising: a first sensor device; a plurality of redundant agent modules, each configured to receive energy usage data from the first sensor device and transfer the energy usage data to a plurality of redundant logger modules; the plurality of redundant logger modules each configured to forward the energy usage data to a plurality of redundant long term storage devices; the plurality of redundant long term storage devices each having storage modules configured to store the energy usage data as raw data; a plurality of redundant web server service modules and web portal modules that subscribe to one or more numerical or visualization templates; the one or more numerical or visualization templates including one or more filter settings that access raw energy usage data in real-time including allowing access to the raw energy usage data within 1 minute from the raw energy usage data being received by one of the agent modules.

A load fingerprinting module stored on a memory and configured to be executed by a processor of a web portal module of the energy monitoring and data visualization system, the system including a first sensor device; a plurality of redundant agent modules, each configured to receive energy usage data from the first sensor device and transfer the energy usage data to a plurality of redundant logger modules; the plurality of redundant logger modules each configured to forward the energy usage data to a plurality of redundant long term storage devices; the plurality of redundant long term storage devices each having storage modules configured to store the energy usage data as raw data; a plurality of redundant web server service modules and web portal modules that subscribe to one or more numerical or visualization templates; the one or more numerical or visualization templates including one or more filter settings that access raw energy usage data in real-time including allowing access to the raw energy usage data within 1 minute from the raw energy usage data being received by one of the agent modules; and the load fingerprinting module including instructions that when executed by the processor cause the processor to: to estimate a type of electrical load and a device that may be causing the load from various power characteristics.

DESCRIPTION OF THE DRAWINGS

FIG. 1A illustrates an exemplary energy usage data storage distribution system. FIG. 1B illustrates an exemplary energy usage data monitoring and presentation system. FIG. 1C illustrates an exemplary cloud/distributed computing system.

DETAILED DESCRIPTION

Advances Over Recent Attempts

Figure 1:
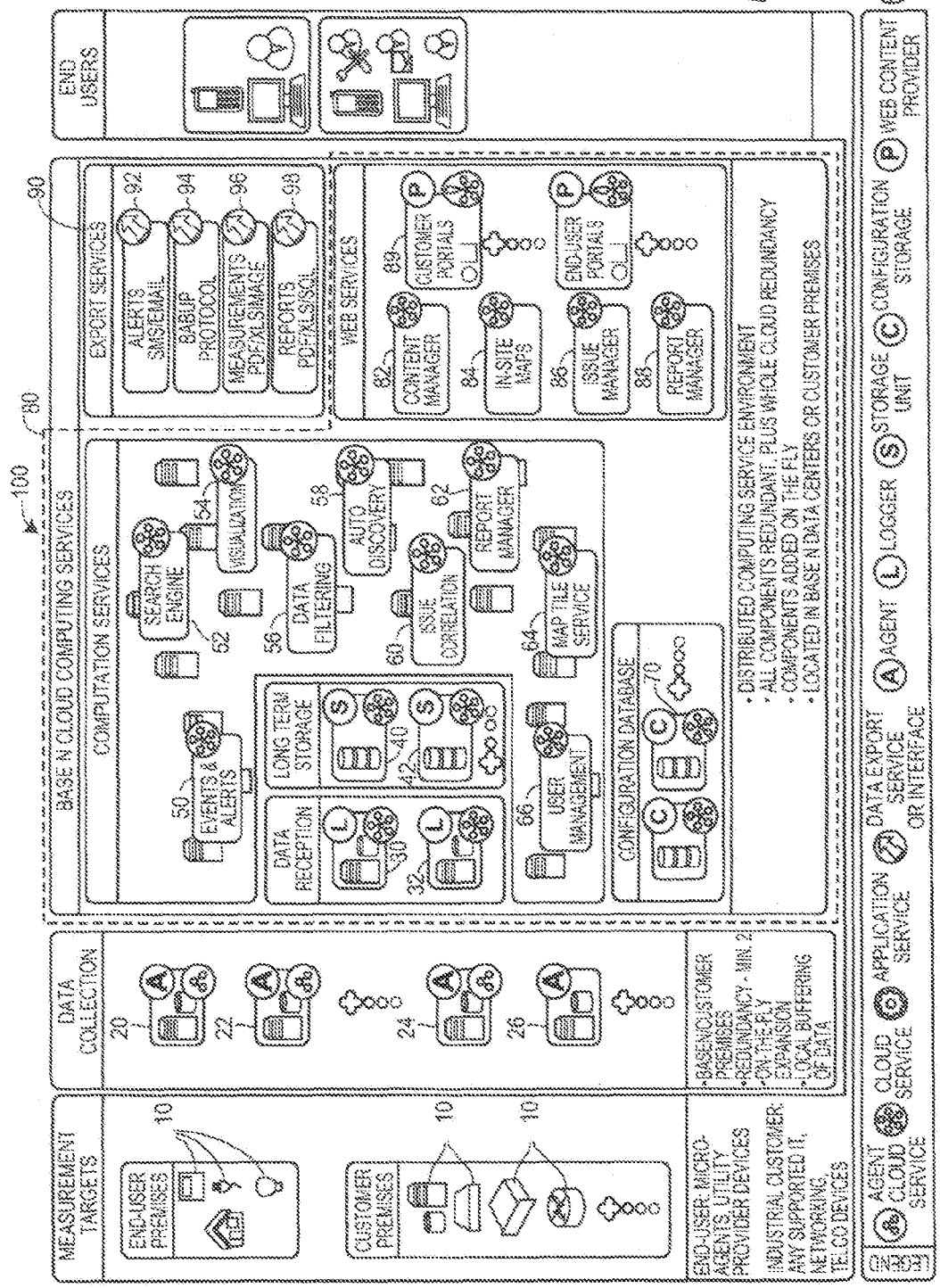
FIG. 1 is an exemplary architecture diagram of a smart grid system, which includes a combination of an energy usage data storage distribution system, an energy usage data monitoring and presentation system, and a cloud/distributed computing system.

The Open Source Software (OSS) and network management space is filled with companies and teams that have tried to build scalable and extensible software solutions capable of monitoring millions of energy devices while also being able to provide access to data associated with the usage of those devices in real-time. So far all attempts have failed. The attempts have not been able to quickly store the large amount of data effectively, and moreover have not come close to any solution that is able to access the data effectively.

Examples of these attempts are typically built with various approaches of distributed designs, including multiple servers working in a hierarchy or using probes, to scale up. These attempts do not work well in networks over a 50K device size, if even at that level. These attempts are: EMC Ionix (fault monitoring part based on their acquisition of Smarts), IBM Tivoli NetCool, HP OpenView and TMIP, InfoVista, Cisco ANA, CiscoWorks LMS. These systems have in some cases already been designed out of a capability for greater scalability because of the limits imposed by their internet service provider accounts. The closest system that may compete is likely the AT&T telephone backbone system, which is estimated to include just over 100K devices. The list can be filled in to be much longer but it would just mean a repetition of products with architectures that were designed for smaller networks, which would not work well in a larger scale system, such as a smart grid system. A smart grid system includes millions of energy monitoring devices, such as IP configured devices, that have to be monitored in the same network in real-time.

The disclosed system and method is capable of monitoring, storing, accessing, and presenting information in real-time from a system that is capable of handling a larger scale of customers than the current and other attempted systems are capable of handling. Embodiments of the disclosed system and method are capable of monitoring and accessing information in real-time from a smart grid type system. Embodiments of the disclosed system and method are capable of collecting and also monitoring the high amounts of data that run across the system to make sure data is flowing through the system correctly.

In architectural terms, the other systems are not able to scale horizontally to be able to capture an accurate view of the entire system topology of a large system. The other systems also have a vertical problem is accessing the data across a smart grid system, as the other systems provide monitoring at a certain layer of the network (i.e., OSI (Open Systems Interconnection Model) Layer 3 or Layer 2, or Voice traffic only), and also do not combine this data with much else also going through that system. Other systems are often not very easily extensible to also capture other relevant types of events in the same network. With the disclosed system architecture the system may be extensible to capture other relevant data in a matter of hours. The disclosed system and methods may provide the customer with access to data across the entire system, including system topology views and interfaces, without requiring what the other systems would require, which would be the addition of about 10-15 more monitoring tools simply because there may be 10-15 more types of data running across that network.

Example Embodiments—Capturing and Storing Data

The embodiments described herein integrate together to form a larger system that encompasses the respective operations to provide an overall smart grid system that is capable of collecting, monitoring, storing, computing, and presenting massive data flow information, such as energy usage data, in real-time.

A "/" means "and/or" throughout the disclosure. A "device" described herein includes hardware (e.g., a device including any one or more combinations of processor, memory, I/O devices) and/or software modules or service modules that may be integrated to obtain input and produce output as required by the hereby provided application disclosure, and as would be understood by one of ordinary skill in the art at the time of the invention. The term "system" herein is interchangeable with the term "network." While the functionality of the process blocks is exemplified herein as occurring in a particular device, it is understood that other hardware/software modules/configurations/protocols may be used, but are not described herein to keep the application description practical.

Figure 1A:
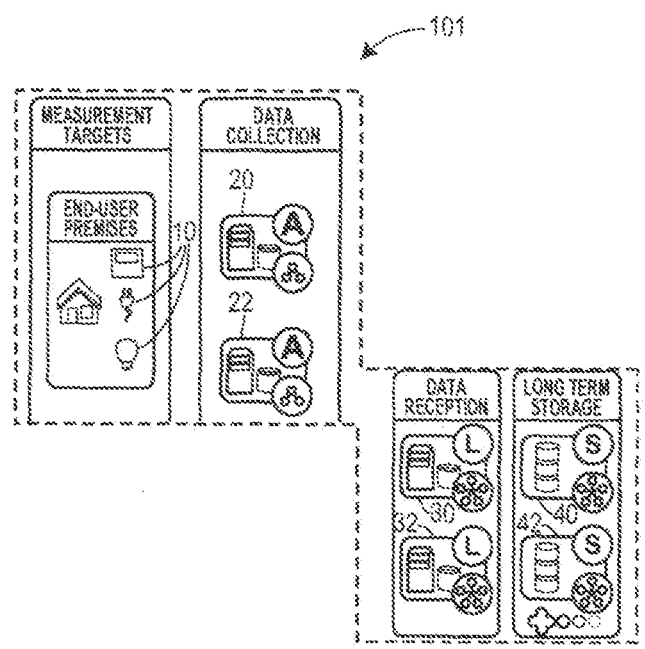
FIGS. 1A-1C illustrate individual examples of the sub-systems of FIG. 1 for easier viewing.
Figure 1B:
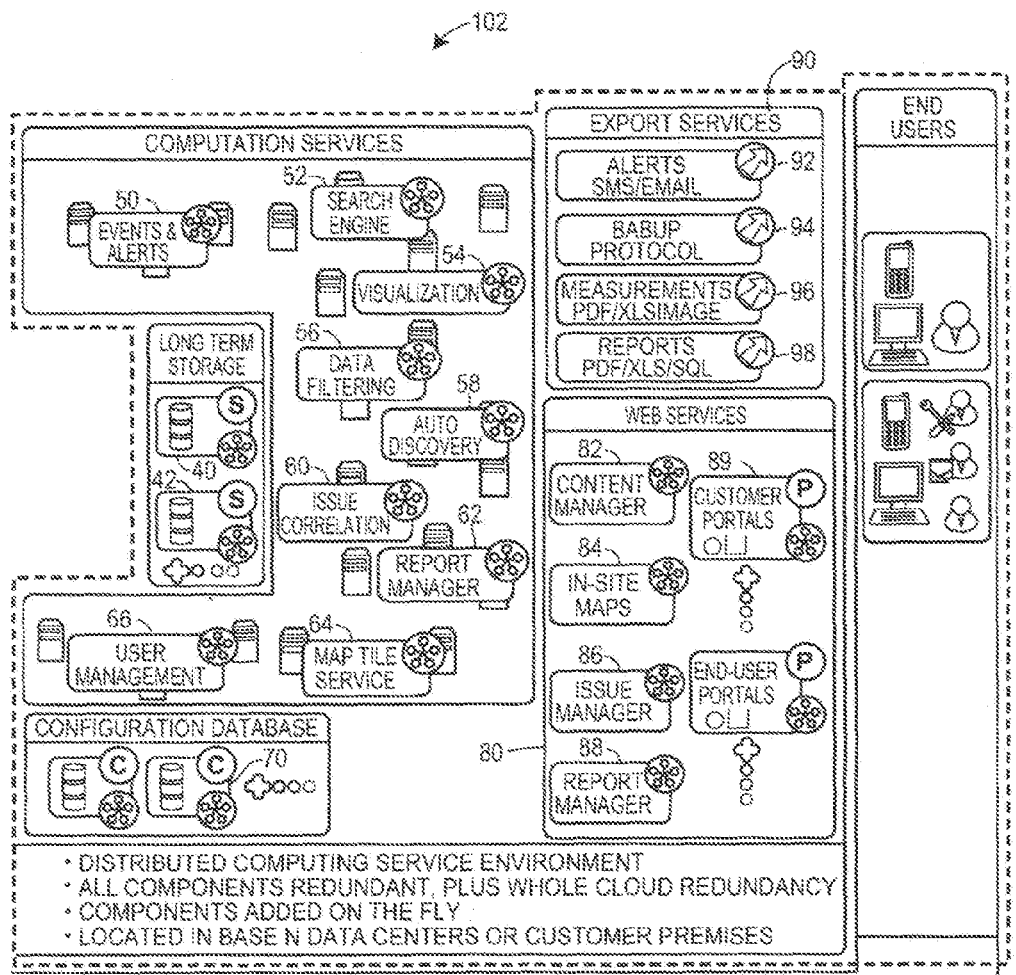
Figure 1C:
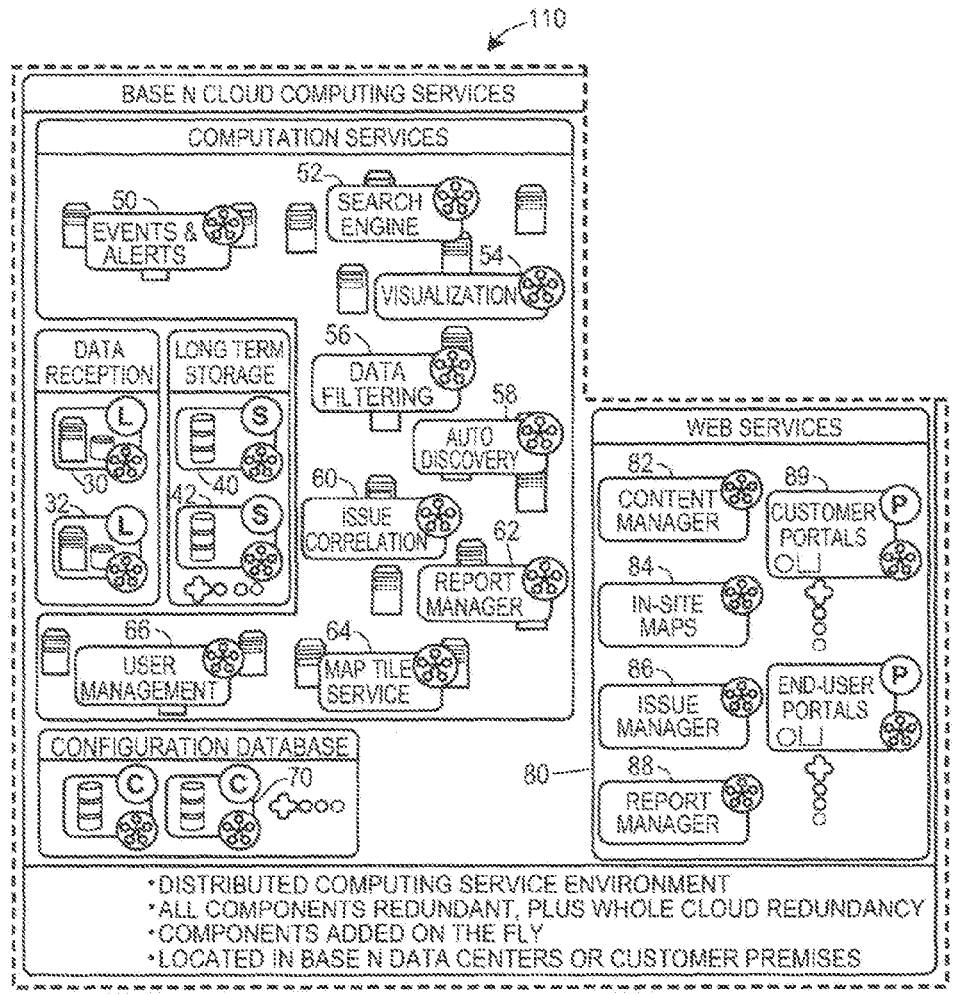
Figure 1D:
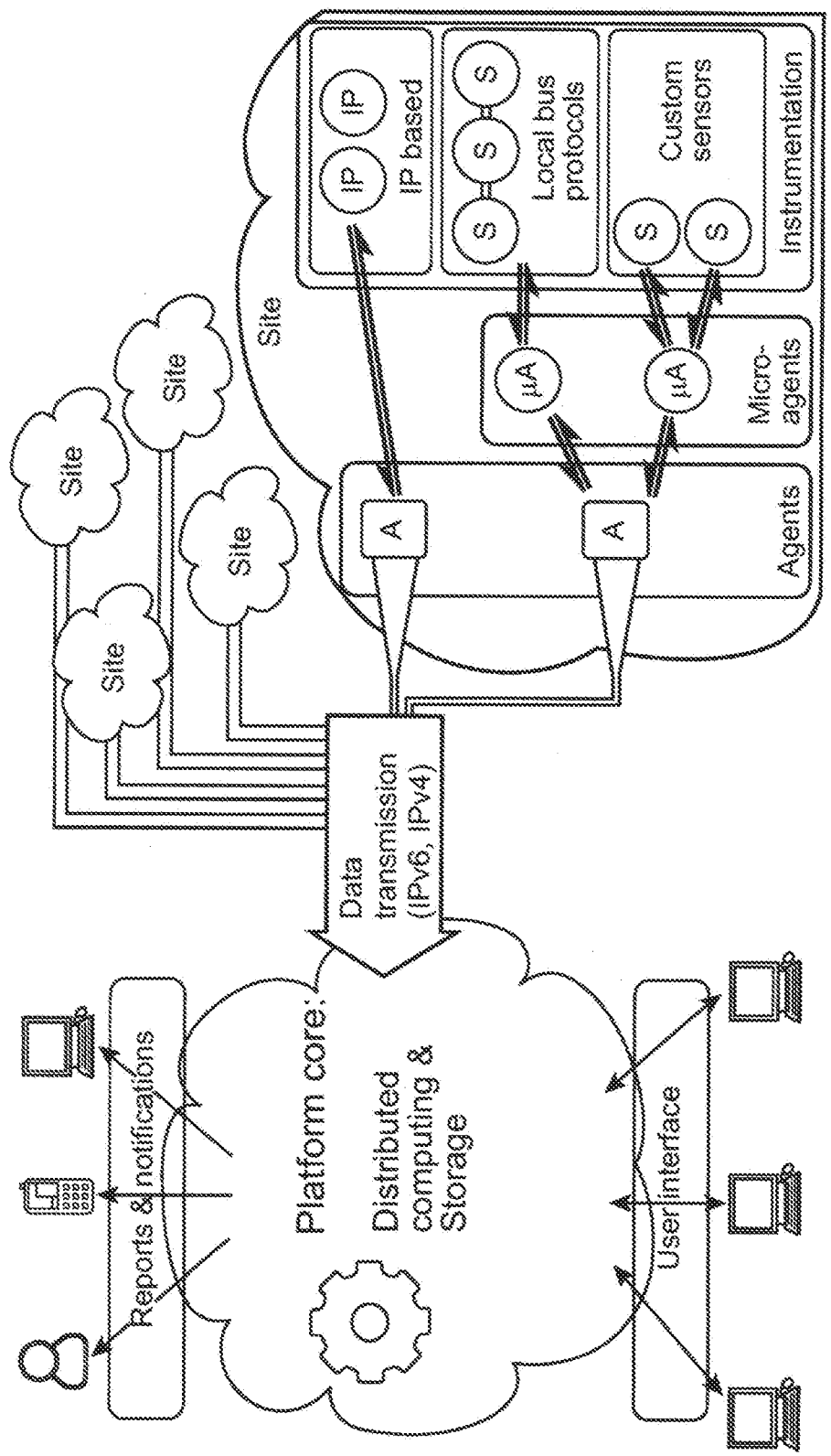
FIG. 1D is an exemplary smart grid system of FIG. 1 depicting an alternative high level view of the system.

FIG. 1 is a diagram of an exemplary smart grid system 100 that includes three systems: an energy usage data distribution storage system 101 (see FIG. 1A) and an energy usage data monitoring and visualization system 102 (see FIG. 1B), and a distributed computing system 110 (see FIG. 1C). FIG. 1D is an alternative higher level view of an exemplary smart grid system 100 of FIG. 1.

FIG. 1A illustrates the example energy usage data distribution storage system 101, which includes energy consumption measurement devices, such as any one of a sensor or measurement devices 10; data collection devices, such as redundant agent devices 20-22; data distribution devices, such as redundant logger devices 30-32; and storage devices, such as redundant storage units 40-42. These devices may integrate together to execute an inbound data distribution storage process, which may be executed using the example redundancy configurations of FIG. 2A-2B or any combination of parts of the two configurations.

Redundant Distributed Architecture

Figure 2A:
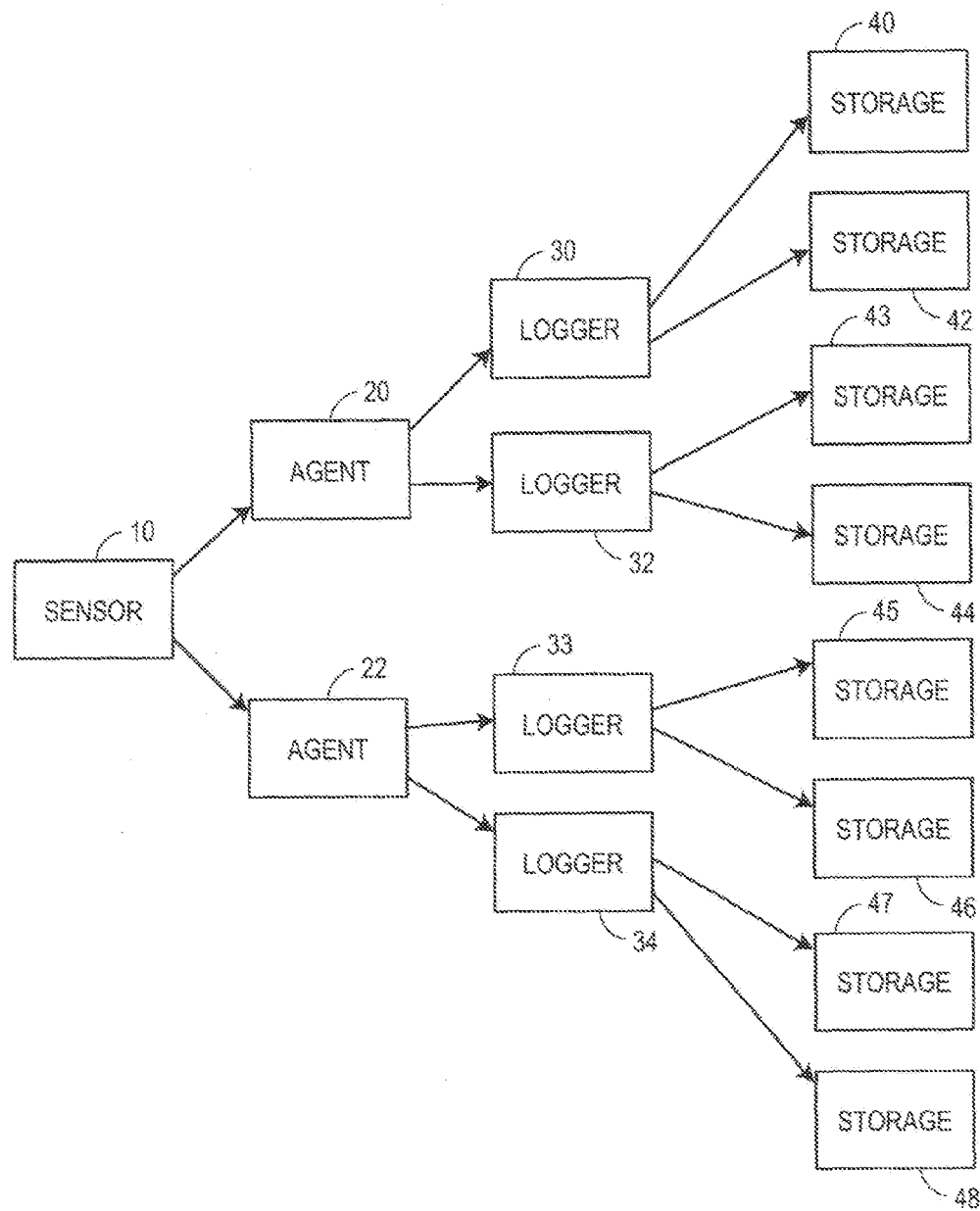
FIGS. 2A-2B illustrate embodiments of two example redundancy configurations for an inbound energy usage data storage distribution process that may be used the example smart grid system of FIG. 1.

FIG. 2A illustrates a first example redundancy configuration that may be used by the example energy usage data distribution storage system 101. For example, a sensor/measurement device 10 may transmit duplicate energy data usage information to two different agent devices 20, 22. Each agent device 20, 22 may send duplicate energy data usage information to two different logger devices 30, 32 and 33, 34 respectively. Each logger device 30, 32, 33, 34 may in turn send duplicate energy data usage information to two different storage devices 40, 42, and 43, 44, and 45, 46, and 47, 48, respectively.

The example energy usage data distribution storage system 101 may employ the architecture illustrated by FIG. 2A to provide redundancy for the data. This high level of redundancy may be used to ensure access to the data despite possible faults existing with any one device in the example energy usage data distribution storage system 101.

Figure 2B:
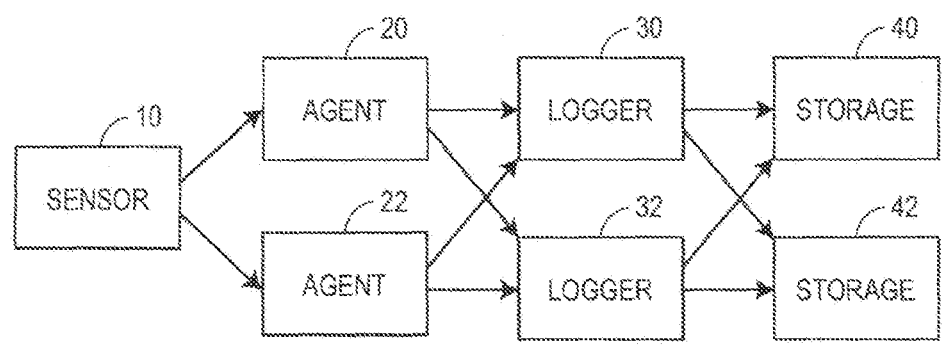

FIG. 2B illustrates a second example redundancy configuration that may be used by the example energy usage data distribution storage system 101. The redundancy configuration of FIG. 2B provides less protection from failed devices, but saves on resource costs. Other possible redundancy configurations fall between the two types of redundancy architectures of FIG. 2A and FIG. 2B.

Figure 3:
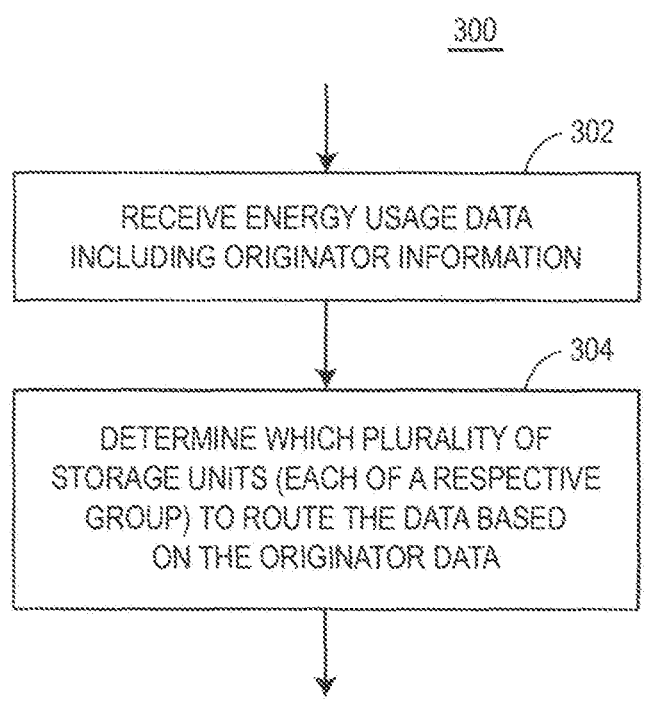
FIG. 3 illustrates an exemplary flow diagram of an energy usage data storage distribution process.

An inbound data distribution storage process that may be executed across the redundancy architectures of FIG. 2A and FIG. 2B or a configuration in between includes using the example storage distribution method, as illustrated in FIG. 3. The devices of the energy usage data storage system 101 may receive and store the data as it becomes available in real-time.

An example of an embodiment of the smart grid system 100 includes a system of a size of 1500 processor cores, hundreds of terabytes of stored data, and 10 million incoming individual energy usage measurements at a sub-minute time resolution. Each device of the system 100 may include any embodiment of a computing device, such as the server illustrated in FIG. 14.

Figure 14:
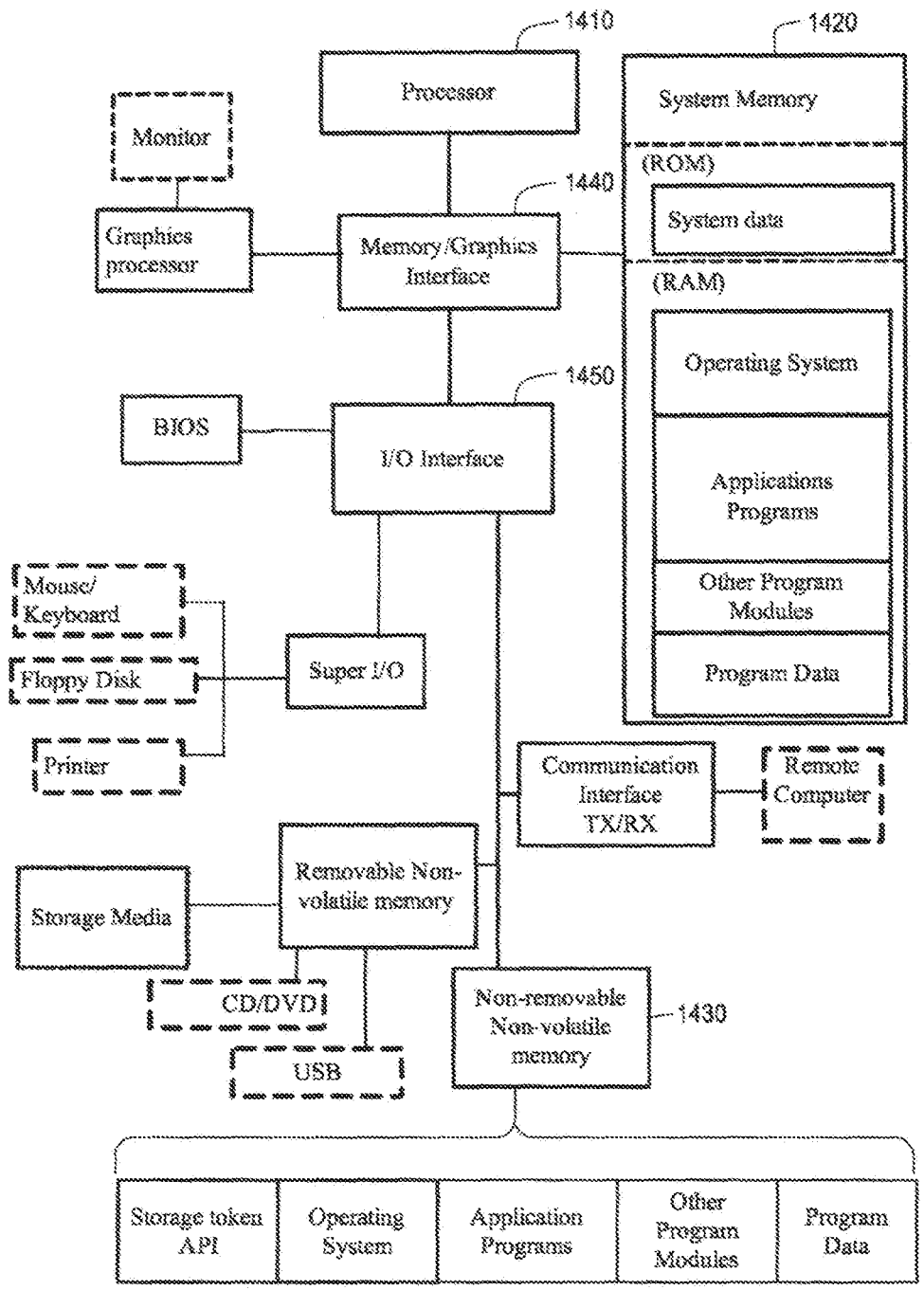
FIG. 14 is a general purpose computing device suitable for hosting any of the particular devices of the system described herein.

FIG. 14 illustrates an exemplary device/module 1400 including one or more components that may be configured as any of the respective devices/modules described herein. It is impractical to list every hardware/software/communication link configuration for each device/module described herein. One of ordinary skill in the art after reading this disclosure is able to construct such device/module without undue experimentation. Based on the respective functionality of the device/module described herein, the device 1400 may be any one of a switching device, routing device, telecommunications control equipment device, client device, a name server, an application server, a database server, a communication server, concentrator device that collects information from address-less devices, or a device that accumulates electrical signal information and translates/modulates/time stamps the information received (e.g., converting a voltage information to a bitmap), any individually addressable device, etc. For example, components of device/module 1400 may include, but are not limited to, a processor 1410, a system memory 1420, a non-removable memory 1430, a memory/graphics interface 1440 an I/O interface 1450, a power supply 1450, I/O peripherals, secondary storage, removable media devices, etc as illustrated in FIG. 14. Components shown depicted with a dashed outline are more optional than the other components. Any one or more of the processes described herein may be stored in any computer readable memory of the device 1400.

An embodiment of the system and methods described herein has the ability to perform near-linear scalability when integrating additional devices into its system. For example, embodiments of the system are easy to expand and upgrade when new measurements or new information is added or when new users are added to the system. System costs may be kept lower as the system may utilize standard computer products instead of dedicated supercomputers. For example, standard computer products may be customized to integrate into the system 100 with software that is executed by a processor to perform any of the functions and processes of the respective devices described herein.

The system may be configured to be reliable in cases where a malfunction is the result of a single server failure or a storage disk failure, as well as when whole data centers may be lost. To avoid loss of data in such situations the system 100 may implement mirroring of data by duplicating and retaining data in separate distributed physical locations. Most data may reside in at least two different physical locations, each of which may be accessible by different routes or connections.

An embodiment of the systems and methods described herein may provide distributed computing and storage, fault tolerance, robust data transfer and retention, and flexible target site instrumentation. Communications across the systems described herein may employ communications techniques, including Ethernet, IPv4, IPv6, etc., over physical or wireless connections.

Real-Time Storage Distribution

With the ability to access information about energy usage per customer unit at a real-time speed and at lower granularity levels, a customer has the information to better control energy usage which may result in reduced costs. "Real-time" may be defined as the time the data becomes available. "Real-time" may be defined as when the time to process the energy usage data from the receiver of the logger device to the storage space is at least the time at which the energy usage data becomes available. "Real-time" may be defined as a time range that enables the customer to have access to the energy usage data within one minute from the reading of the data from the sensor device or as the data becomes available. "Real-time" measurement and access to data may also be defined by the taking of measurements by a sensing or measurement device 10 anywhere from one minute intervals to under one second intervals and the user having the ability to access such data within a minute of its reading.

A recent case study found that energy customers would benefit from such a fast access time to their energy usage data. In particular, the case study that found that residents who had access to readily available immediate and historic energy usage information were able to spot inefficiencies and malfunctions, and were encouraged to employ economical everyday usage patterns, and were more motivated to make improvements and adjustments to any home automation systems they may have.

Figure 13:
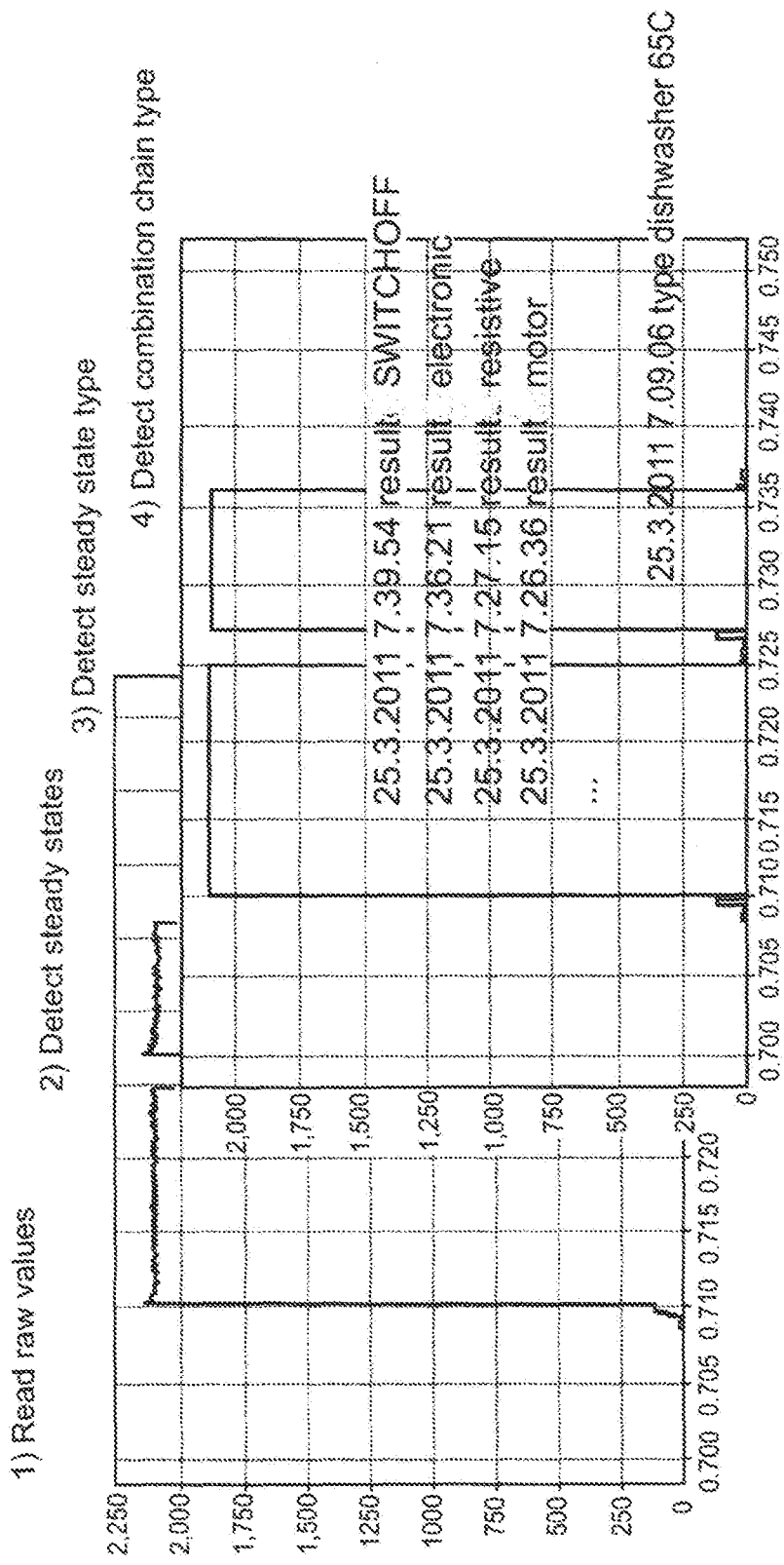
FIG. 13 illustrates an example process of load fingerprinting, which may be used to detect what device may be the cause of a sequence of energy usage or loads readings.

When a user is able to obtain information of energy usage with such granularity a user may be able to discern what appliance in his home is using energy. For example, when a user has sub-minute access (e.g., access to measurement information which occurred within 30 seconds to 1 minute prior to the request for information) to his energy usage data, a user may be able to correlate his actions with the energy usage data feedback, which may be described as "load fingerprinting." Load fingerprinting may be described as the ability to distinguish the load by the particular energy usage characteristics of the particular load, e.g., based on energy usage patterns of the particular load. For example the data flow in FIG. 13 proceeds from simple average power (which may be displayed to the user) to detecting various steady operational states (also used to detect devices in standby mode) to single state fingerprinting (detecting what type of load is being observed) to detecting what device could cause such a sequence of loads.

With such fast feedback, a user is able to see the energy usage results from their immediate actions so that the user may make better decisions on how to spend their energy. Some of the greatest benefits have been achieved by the user being able to monitor and adjust their HVAC, heat pump, solar panel, and other devices for optimal use, by their being more immediately aware of installation problems, malfunctions, or inefficiencies. The user may be presented with any form of presentation of their energy usage data. For example, a user may be presented with their historical energy usage data in any time frame or per appliance along with an associated cost of energy consumed.

Bi-directional communications may be added on to the system when needed. The system may also provide remote control of energy usage for larger users and energy producers. The benefits described herein are not efficiently or practically possible with any of the previously known systems or attempts.

The system 100 includes any type of sensor or measurement devices 10 that may be located at the customer site. For example, the sensor or measurement devices 10 may include devices that themselves use energy (e.g., smart appliances, smart meters, and industrial device that reports their energy consumption), devices that monitor energy usage of other appliances, devices that sense variables including ambient variables (e.g., any voltage or current information, temperature, CO2, etc.)

For example, the sensor or measurement devices 10 may include any electrical sensing or measuring devices, such as devices that may measure any one or more of: appliance energy consumption, measure a root mean square (RMS) value of a current, an RMS of a voltage, an active power, an apparent power, a power factor, a phase shift, a crest factor, harmonics, total harmonic distortion, energy, etc. Other uses for the system and processes described herein may be to measure other types of data such as carbon dioxide emission data, communication system data, or any other data that may be transferred using packet data.

The sensor or measurement devices 10 may send data by wire or wirelessly. The sensor or measurement devices 10-18 may be able to perform measurements with different connection types. The sensor or measurement devices 10 may be able to handle most common disturbances in existing electricity networks and may not cause any disturbance to other devices. The sensor or measurement devices 10 may be certified by a customer electronic agency and may be compliant to government regulations including wireless or product safety requirements.

The sensor or measurement devices 10 may be devices that may measure ambient variables at a site or that may measure variables that may be used to inform a user whether the site is operating on target (e.g., temperature of room) or to tell whether a user settable guard is active. The sensor or measurement device 10 may be a device that may control lamps. The sensor or measurement device 10 may be a device that uses an internal battery or other power source. The sensor or measurement device 10 may be a pulse electrical reader that uses an internal battery. The sensor or measurement device 10 may send analog or digital data to a plurality of redundant agent devices 20-22. The sensor or measurement device 10 may send a message that includes the following information: address of the sending sensor (e.g., originator information), time base, time difference to time base, message type information, and message data (e.g., energy usage data).

The system 100 includes redundant agent devices 20-22, which may be physically assigned to each part of a monitored system. An agent device 20 may be configured to communicate with or receive any type of sensor or measurement analog or digital data from any type of sensor or measurement device 20. An agent device 20 may also communicate with other sources of data, such as a third party vendor. For example, an agent device 20 may request and receive weather data form a third party database.

An agent device 20 may be a redundant wireless base station device that may receive data having a single receiver format, and may use a data receiving queue and a data sending queue. An agent device 20 may use HTTP protocol to communicate with other devices on the system 100. An agent device 20 may collect data from a sensor or measurement device 10 and may be able to communicate back to a sensor or measurement device 10. An agent device 20 may collect data and convert the data to any protocol that the system 100 uses, such as converting from BASP to BABUP, or converting the received data to other protocols, such as Plugwise, So (DIN 43864 standard pulse output) pulse Moxa SNMP information.

An agent device 20 may receive energy usage data twice per minute from a sensor or measurement device 10. An agent device 20 may receive and process and hold data before sending the energy usage information on to a logger device 30. The system may operate in a burst mode, instead of sending a continuous stream of data. BABUP messages may be transmitted by the agent device 20 as binary or text using HTTP and POST as the transport protocol. The agent device 20 may also use other protocols to interface with third-party products, such as: MobBus, X10, Sensor XML, DLMS/COSEM, Ember.

The example system 100 of FIG. 1 includes redundant logger devices 30-32 and redundant storage devices 40-42. The redundant logger devices 30-32 and redundant storage devices 40-42 may form part of a subordinate system 110 of system 100. The system 110 may employ an announcement protocol described herein and may include service providing devices, such as an event/art service device 50, a search engine service device 52, a visualization service device 54, a data filtering device 56, an autodiscovery service device 58, an issue correlation service device 60, a report manager service device 62, a map tile service device 64, a user management service device 66, a configuration management service device 68, a configuration database service device 70, web portal service devices 80, 82, 84, 86, 88, 89, and export service devices 90, 92, 94, 96, 98. The system 110 includes the devices and their respective software service modules of system 100, which use an announcement protocol, which is described in more detail below.

The system 110 includes at least redundant logger devices 30-32 and redundant storage devices 40-42. The system 110 may additionally include redundant devices for the remaining service devices. The redundant architecture for the devices of system 110 along with the announcement protocol described herein, and the real-time processing operations obtained at each of the sensor device 10, the redundant agent devices 20, the redundant logger devices 30, and the redundant storage devices 40 that enable the system 100 to provide the storage and access of the raw energy usage data in a way that makes the system dynamic, scalable, and flexible, and able to store and retrieve massive amounts of data in real-time.

Each of the redundant logger devices 30-32 may be a device that receives incoming data from the agent devices 20-26 and may process the data to determine which storage device 40 to use. Each logger device 30 may process the data using a quickly executed storage distribution algorithm, or spreading algorithm. Each logger device 30 may send the data to a distributed storage system 120 that includes redundant storage devices 40. Each logger device may also process the data to determine whether any thresholds have been breached. If breached the logger device 30 may send the data to an event and alert service device 50 so that proper notification and presentation of the relation information may result. Each logger device 30 may store the energy usage data as raw data.

System 100 may also include any one or more devices 50-98 that may include one or more respective type software service modules. Each service module may be either a primary or a backup service module with respect to another service module that may require its services. For example, an event and alert service module of event and alert device 50 may be the primary service module to the logger service module of logger device 30. Whereas, the system 100 may also include a backup event and alert service module for logger device 30. The determination of which logger service module is primary or backup may be made at each logger device 30 based upon physical distance information, such as hop count information, which may be received by announcement messages that each service module transmits to the system 100.

FIG. 2A illustrates and example configuration of the redundancy of the inbound energy usage data flow to the system 100. Sensor 10 may send energy usage data to a plurality of agent devices 20, 22. The agent devices may send duplicate data to redundant logger devices 30, 32 and 33, 34. Each logger device may send data to respective redundant storage devices 40, 42 and 43, 44 and 45, 46 and 47, 48. The redundancy of each device and its respective software service module enables the system 100 to operate more reliably. In addition to the reliability of the architecture of system 100, system 100 also includes an energy usage data distributed storage algorithm, which stores data for fast and easy storage and subsequent fast and easy access.

FIG. 2B illustrates another example configuration of the redundancy of the inbound energy usage data flow to the system 100. The redundancy configuration illustrated in FIG. 2B shows two different agent devices 20 that send duplicate information to the same logger devices 30, which may in turn send duplicate data to the same storage devices 40. Any combination of the above redundant configuration 2A or 2B elements may be used by the systems and the storage distribution methods described herein.

Storage Distribution Processes

FIG. 3 is an exemplary flow diagram of a storage distribution method 300 that may be employed by the devices of system 100. Storage distribution method 300 includes receiving energy usage information, which includes an associated origination information data (block 302). A device that may receive the energy usage information may be a logger device (block 302). The system 100 may have a plurality of storage devices, where each storage device (e.g. 40) is part of a plurality or group of two or more storage devices (e.g., FIG. 1A, 40a-40f.). The method 300 determines which storage unit of the plurality of storage units is to receive and store the energy usage information. The determination is made based on the origination information data that is received along with the received energy usage data information (block 304). The data may be received as a measurement packet message that may have a format of any of the energy usage measurement data packet formats, as described below with regard to FIG. 6, or similar formats.

Each storage unit 40 is part of an associated plurality of storage units 40a, 40b, etc. For example, FIG. 1A illustrates a group of six storage units 40a-40f. The group of storage units may be any number of storage units 40. The logger device 30 may additionally transmit duplicate data to a backup storage device, e.g., 42c that may be associated with the primary storage device 40c.

Figure 4:
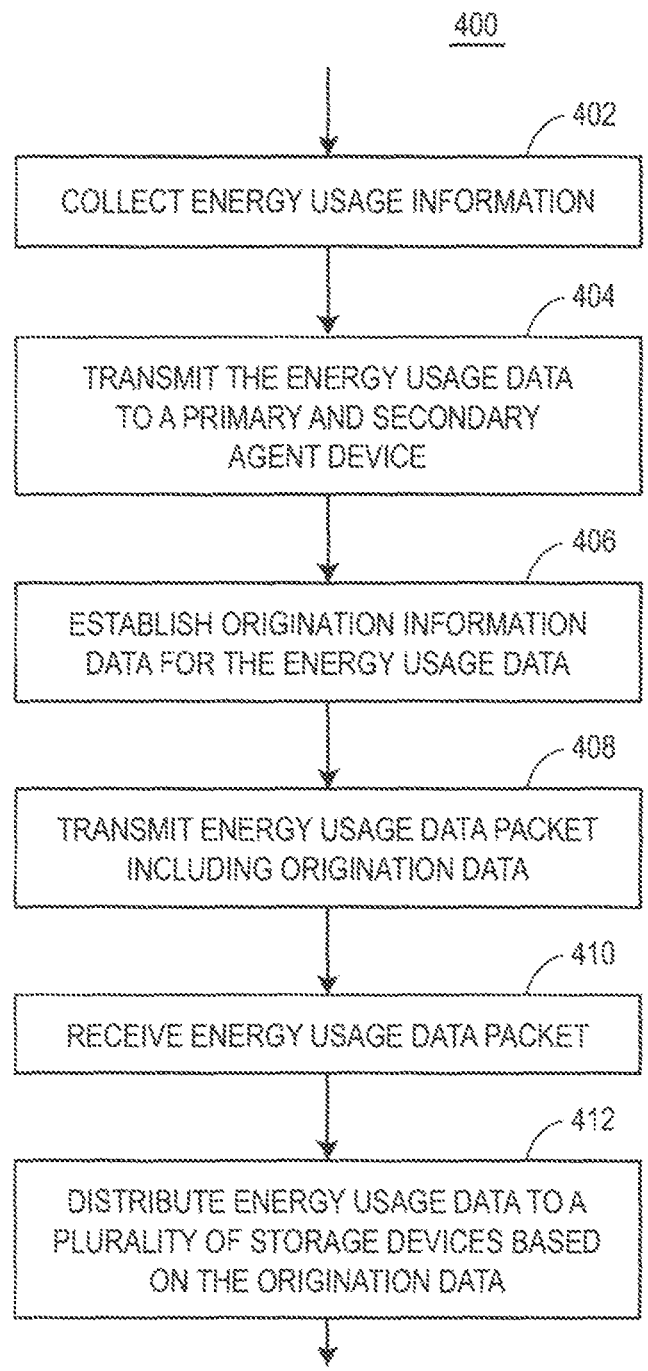
FIG. 4 illustrates another exemplary flow diagram of an energy usage data storage distribution process.

FIG. 4 is another exemplary flow diagram of a storage distribution method 400. Storage distribution method 400 includes collecting energy usage information (block 402) from any type of sensor or measurement device 10. The energy usage information may be transmitted to a local data collection agent 20 (block 404) in digital or analog form. The energy usage data may also be sent to a backup data collection agent 22 (block 404) in addition to the primary agent device 20.

A local data collection agent 20 may establish origination information data for the energy usage data, wherein the origination information data is indicative of the identification of the particular sensor or measurement device (block 406). The agent device 20 may transmit the energy usage data information along with the origination data information as part of an energy usage data packet to a logger device 30 (block 408). The logger device 30 may receive the energy usage data packet (block 410) and may distribute the energy usage data to one of a plurality of storage devices (block 412). The logger device 30 may determine which one of a group of storage devices 40a-40f, etc. to use to store the energy usage data based upon an operation that the logger device 30 may perform on the received origination data (block 412). The logger device may additionally transmit duplicate data to a backup storage device 42c that may be associated with the primary storage device 40c.

The processing time accomplished by the logger device 30 or any other device within the system 100 may be required to be performed within a time range so that the system 100 may perform an energy usage data storage distribution process (e.g., 300, 400, etc.) in real-time, wherein real-time is including a time range that enables the user to have access to the energy usage information data within one minute from the reading of the data by the sensor or measurement device. Thus, the energy usage data storage distribution process may operate in real-time. The real-time operation may be performed by constraining block/s of the process to be executed within a particular time range/s.

Figure 5:
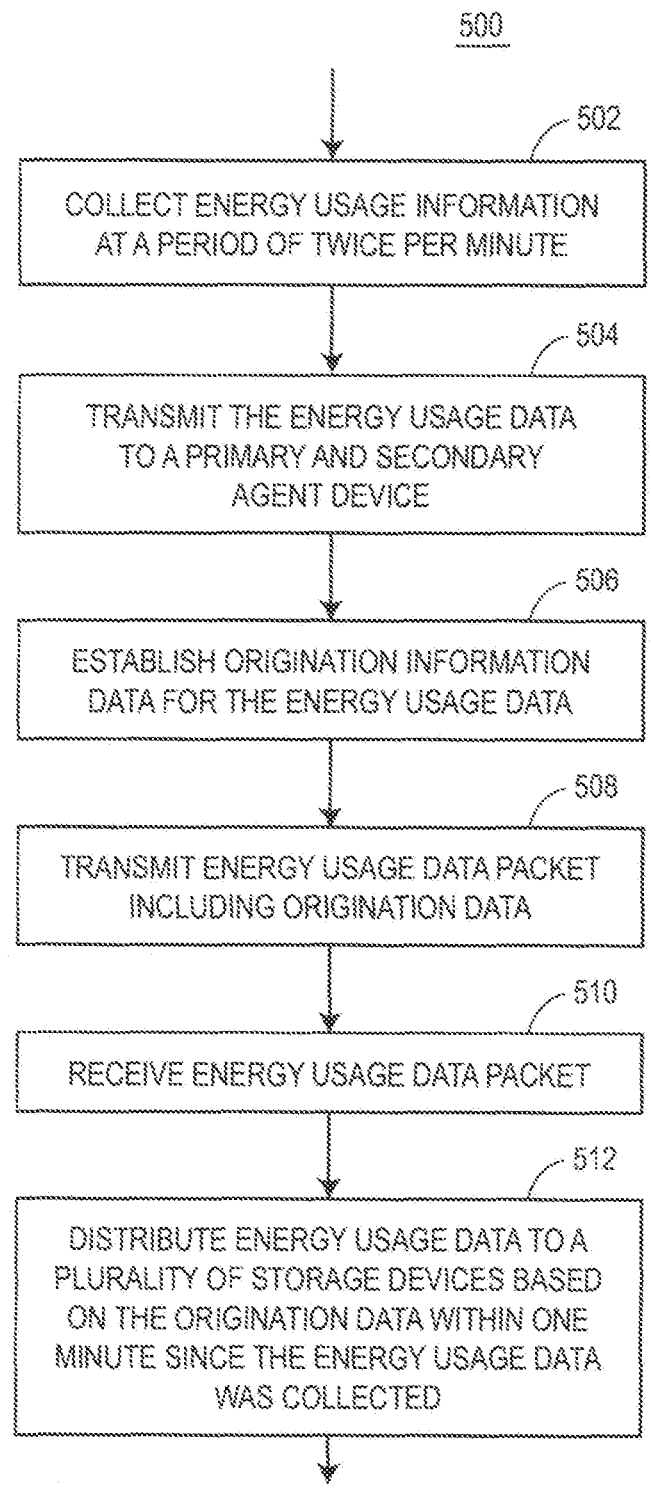
FIG. 5 illustrates another exemplary flow diagram of an energy usage data storage distribution process that includes example real-time timing information.

For example, FIG. 5 illustrates the corresponding blocks of FIG. 4 (402-412 to 502-512) with additional time reference indications (502, 512) that may be used to better define a real-time operation of the energy usage distribution process. For example, collecting energy usage data (block 502) may occur periodically, e.g. twice every minute. Distributing the energy usage data to a storage device (block 512) may be performed within one minute from the time that the energy usage data was collected at block 502. Other similar time references may also be used.

For example, the following devices may execute blocks of the processes illustrated in FIG. 4 and FIG. 5. Each sensor device 10 may range from a highly specialized sensor/controller (such as those built for HVAC equipment) to low cost commodity sensors. The sensor device 10 may not provide much logic besides forwarding the energy usage information to an agent device 20.

The sensor device 10 may collect the sensor information (block 402) and then transmit the sensor information (block 404) to both a primary and a secondary data collection agent device 20, 22. Each collection agent device 20 may establish origination information data to be associated with the collected energy usage data (block 406) along with timestamp information. Each collection agent device 20 may use a message protocol (e.g., BABUP) when transmitting (block 408) the energy usage information 602, associated origination information data 604, and timestamp information data 606 (in for example a single packet message 600 of FIG. 6) to the primary data distribution logger device and to the secondary data distribution logger device 30. Alternatively, each collection agent device 20 may hold the energy usage information for a time and then send the energy usage information in an aggregate form (e.g., several packets at a time).

Additionally, each sensor device 10 may also respond to a query for information received from an agent device 20. Each sensor device 10 may monitor or measure, in real-time, (e.g., as the data becomes available) the energy that is being used. Each sensor device 10 may produce measurements of energy usage on a sub minute scale. For example, each sensor device 10 may take measurements that may range from a rate of at least once per minute and up to a rate of once every second. For example each sensor device 10 may take measurements at a rate of twice per minute.

The sensor devices 20-28 may collect the energy usage information at repeated time intervals (block 502). The sensor devices 20-28 may transmit the energy usage information data to each of the agent devices 20-28 (block 504). Each of the agent devices 20-28 may establish origination data information for the energy usage data that it received (block 506). Each of the agent devices 20-28 may send one or more energy usage data packets 600 (See FIG. 6) to a data logger device 30 (block 508). The data logger device 30 may include a master and a backup logger device combination 30, 32 that is capable of receiving a multicast or broadcast type message protocol. The data logger device 30 may receive the energy usage data packet 600. The energy usage data packet 600 includes the originator data information 602 (See FIG. 6).

Each agent device 20 may be the only configurable device in the system that has static configuration information associated with it. Each agent device 20 may transmit data up to a logger device 30 about twice per minute (block 508). The agent device 20 may transmit the data at the same or a similar rate to the rate at which the data comes in from the sensor device 10. For example, the agent device may transmit the data at a rate that maintains a real-time (e.g., as the data becomes available) access and storage of the energy usage data.

Figure 12:
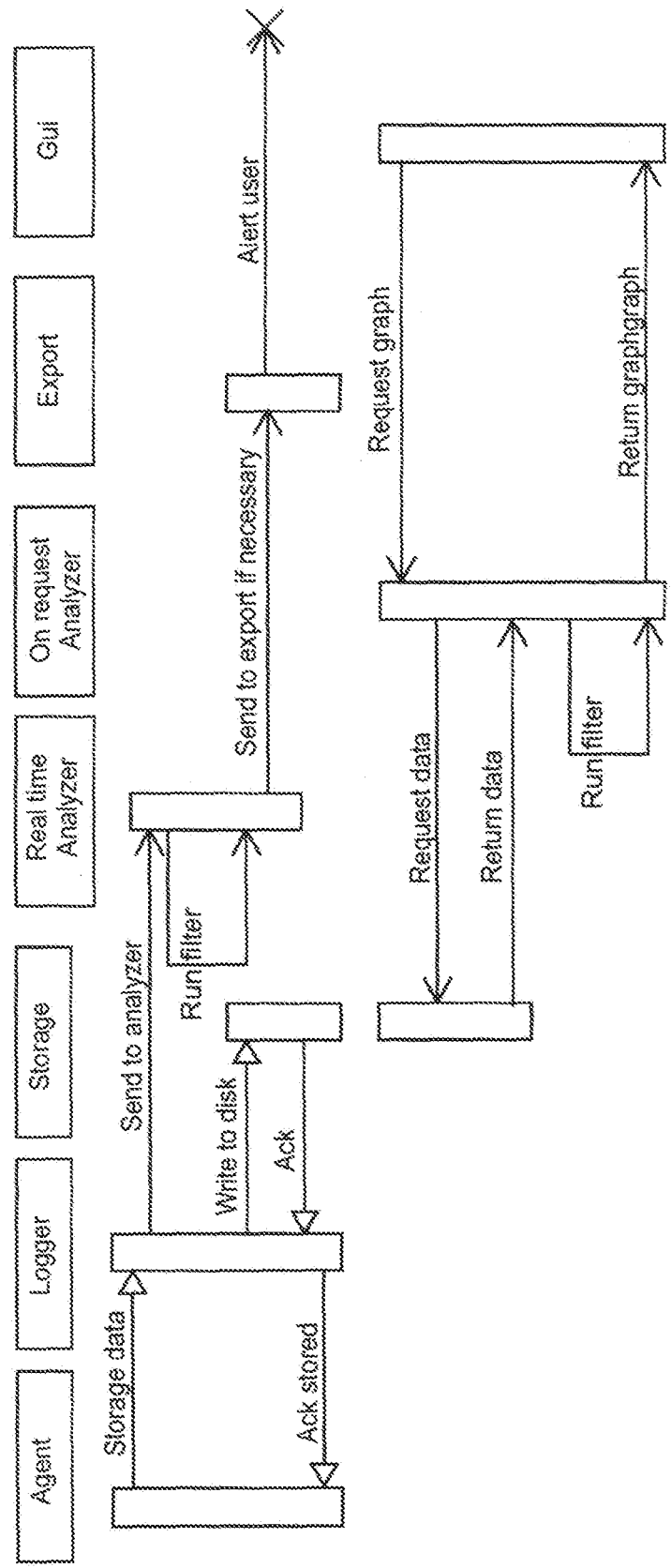
FIG. 12 illustrates example incoming and outgoing data flow in the system of FIG. 1.

Besides determining where to store the energy usage data, the logger device 30 may also receive the data and then process the data to determine if any particular noteworthy events have been triggered. At a high level, FIG. 12 illustrates example incoming and outgoing data flow in the system of FIG. 1. A logger device 30 may send information about a noteworthy event to a real-time analyzer, e.g. event and alert module 50.

Example Storage Distribution Processes

The logger device 30 may store the data by applying a storage distribution processes described above with respect to FIG. 3, FIG. 4 or FIG. 5. Each of the storage processes of FIGS. 3-5 performs a calculation on the origination data information to quickly determine which storage device to use to store the energy usage data. An example operation that may be performed on the origination data information includes a spreading algorithm. An example operation includes a spreading algorithm that is capable of quickly executing a determination of where to store the incoming data (e.g., block 512).

For example, the logger device 30 may receive data from a plurality of agent devices 30, 32. Each logger device 30 may quickly provide storage for the information (e.g., individual or aggregate) that it receives as the information arrives from numerous sources by applying a spreading algorithm to the origination data information. Upon receipt of the energy usage data information each logger device 30 may determine and assign a particular value for each origination data information 602 of each information data unit (e.g., individual packet 600 or aggregate form e.g. 610) that it received.

For example, the logger device 30 may assign values for each character of the origination device's assigned string name representation (e.g., sensor name such as "meeting room 7 CO2 sensor 1"). The logger device 30 may convert these individual string characters to respective values, and then sum up the respective values to produce a total sum. The total sum may be operated on by a mathematical algorithm, or simple calculation, such as a modulus operation, e.g., modulus 2, to determine to which storage unit the individual energy usage information packet may be stored. Other coding techniques may also be used. The following is an example of how a string type of origination information 602 may be transformed into a value.

For example, "m" has an Ascii value of 109; "e" has a Ascii value of 101; etc. . . .

For example, see the Ascii table that translates the Ascii value to a decimal value: ASCII CODE Chart—Character and their equivalent decimal values

| Char | NUL | SOH | STX | ETX | EOT | ENQ | ACK | BEL | BS | HT | LF | VT | FF | CR | SO | SI |
|---|---|---|---|---|---|---|---|---|---|---|---|---|---|---|---|---|
| DEC | 00 | 01 | 02 | 03 | 04 | 05 | 06 | 07 | 08 | 09 | 10 | 11 | 12 | 13 | 14 | 15 |
| Char | DLE | DC1 | DC2 | DC3 | DC4 | NAK | SYN | ETB | CAN | EM | SUB | ESC | FS | GS | RS | US |
| DEC | 16 | 17 | 18 | 19 | 20 | 21 | 22 | 23 | 24 | 25 | 26 | 27 | 28 | 29 | 30 | 31 |
| Char | SP | ! | " | # | $ | % | & | ' | ( | ) | * | + | , | - | . | / |
| DEC | 32 | 33 | 34 | 35 | 36 | 37 | 38 | 39 | 40 | 41 | 42 | 43 | 44 | 45 | 46 | 47 |
| Char | 0 | 1 | 2 | 3 | 4 | 5 | 6 | 7 | 8 | 9 | : | ; | < | = | > | ? |
| DEC | 48 | 49 | 50 | 51 | 52 | 53 | 54 | 55 | 56 | 57 | 58 | 59 | 60 | 61 | 62 | 63 |
| Char | @ | A | B | C | D | E | F | G | H | I | J | K | L | M | N | O |
| DEC | 64 | 65 | 66 | 67 | 68 | 69 | 70 | 71 | 72 | 73 | 74 | 75 | 76 | 77 | 78 | 79 |
| Char | P | Q | R | S | T | U | V | W | X | Y | Z | [ | \ | ] | ^ | _ |
| DEC | 80 | 81 | 82 | 83 | 84 | 85 | 86 | 87 | 88 | 89 | 90 | 91 | 92 | 93 | 94 | 95 |
| Char | ` | a | b | c | d | e | f | g | h | i | j | k | l | m | n | o |
| DEC | 96 | 97 | 98 | 99 | 100 | 101 | 102 | 103 | 104 | 105 | 106 | 107 | 108 | 109 | 110 | 111 |
| Char | p | q | r | s | t | u | v | w | x | y | z | { | \| | } | ~ | DEL |
| DEC | 112 | 113 | 114 | 115 | 116 | 117 | 118 | 119 | 120 | 121 | 122 | 123 | 124 | 125 | 126 | 127 |

Thus, using the example Ascii conversion table, the string "meeting room 7 CO2 sensor 1" would translate and then add up to the decimal value of 2,655. A data logger device 30 may process the decimal value 2,655 with a modulus operator, for example modulus 2, to produce an output, which would have the possibility of an output of any one of 0, 1, 2. For example, 2,655 modulus 3 has an output of 0. Whereas a string of "meeting room 7 CO2 sensor 2" would produce a decimal value of 2,656, which would have a modulus 3 output of 1.

Other operator values may be used. The modulus operator may be used as it provides quick execution by a processor when determining where to store the data (block 216). Applying such a fast operation to information that is capable of quick transfer to numerical value, along with the described system architecture, allows for an effective and easily scalable data access and storage system. For example, as new sensor or measurement devices 10 are added to the system, each new sensor or measurement device 10 may be configured with origination name information 2002 that may be processed quickly by the existing storage distribution algorithm so that less if any new configuration setup information is required beyond the sensor or measurement device 10. Other systems do not produce such an effective solution for scaling up a smart grid system.

The logger device 30 may execute the above described example storage distribution algorithm. The logger device 30 may execute any other type of hashing or spreading algorithm, which may produce similar storage determination execution and distribution timing when determining to which storage unit 40 to send the energy usage data 602 along with its other information (e.g., origination information 602 and time information 604).

Figure 6:
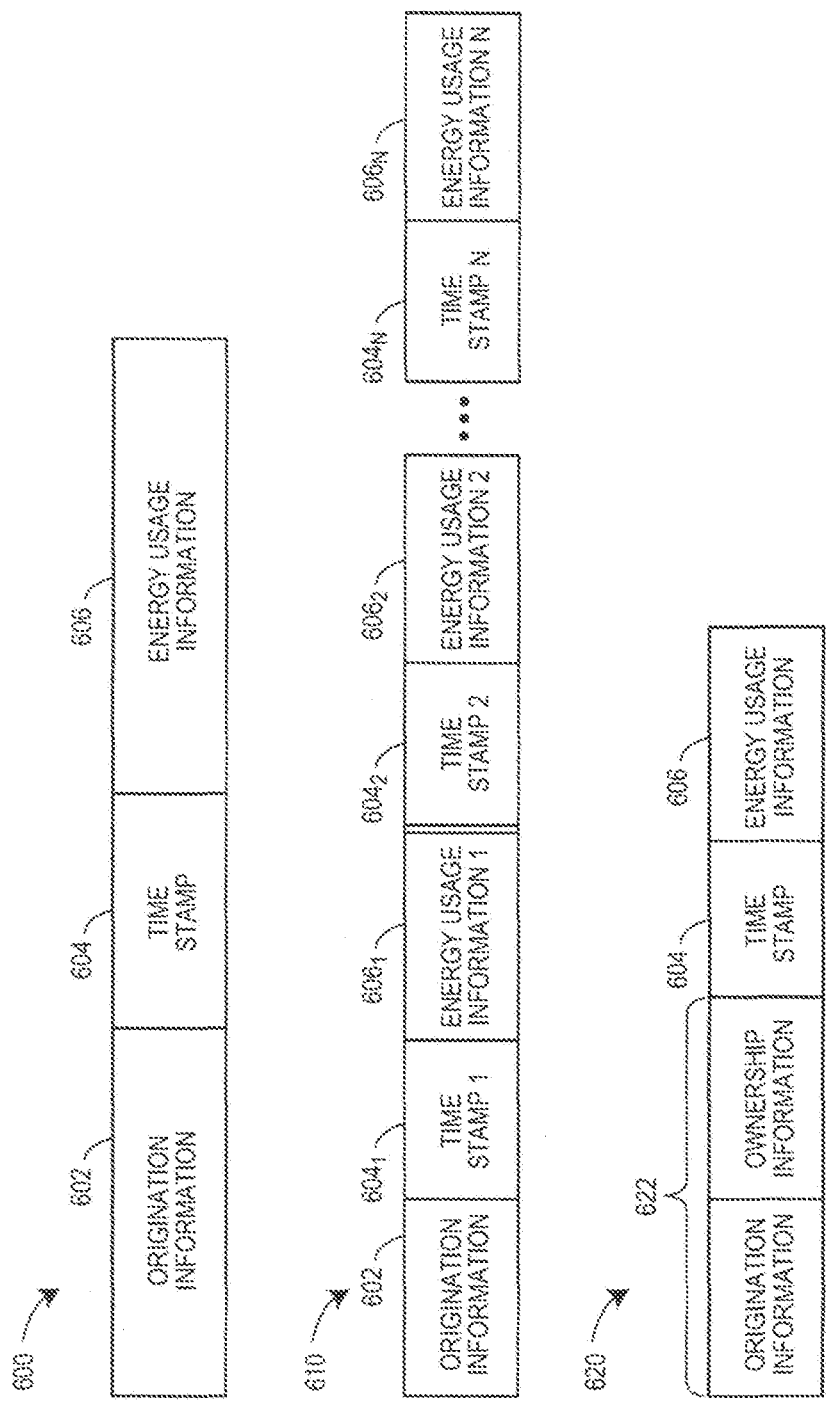
FIG. 6 illustrates some exemplary energy usage data message formats.

FIG. 6 illustrates some example energy usage data packets. An energy usage measurement data packet 600 may, alternatively (e.g. 620), instead of origination information 602, include an origination identifier 622, which is a combination of origination information 622a and the ownership information 622b. The identifier 622 may be a combination or computation of the origination information 622a and the ownership information 622b. An example of an ownership information 602, 622a is a name of the customer that owns the measurement or sensor device 10, etc.

For example, supposing that there are 3 possible storage locations, a modulus 3 operation may be used to produce three possible outputs. For example, each possible output from performing a modulus 3 operation on an identifier 622, or performing a modulus 3 spreading algorithm, may produce outputs of i.e., 0, 1, 2. Each of these output values, 0, 1, 2, may be associated with a particular long term storage unit 40. There may be 3 storage unit devices, e.g., long term storage devices 40a, 40b, 40c, to which logger device 30 may send data. Thus, the energy usage data that arrives from data having an origination information tag "meeting room 7 $CO_2$ sensor 2" may be stored in a long-term storage unit 0, e.g., storage unit 40c as described in the example ascii translation above.

The above-described spreading algorithm may be used to quickly pass the energy usage data 602 to a long-term storage device 40c. Which storage device e.g., 40a-40f, etc. receives the energy usage data message (e.g., 600) may be determined by, and moreover quickly executed by, a spreading algorithm, such as the modulus calculation or a similarly functioning algorithm.

Figure 9A:
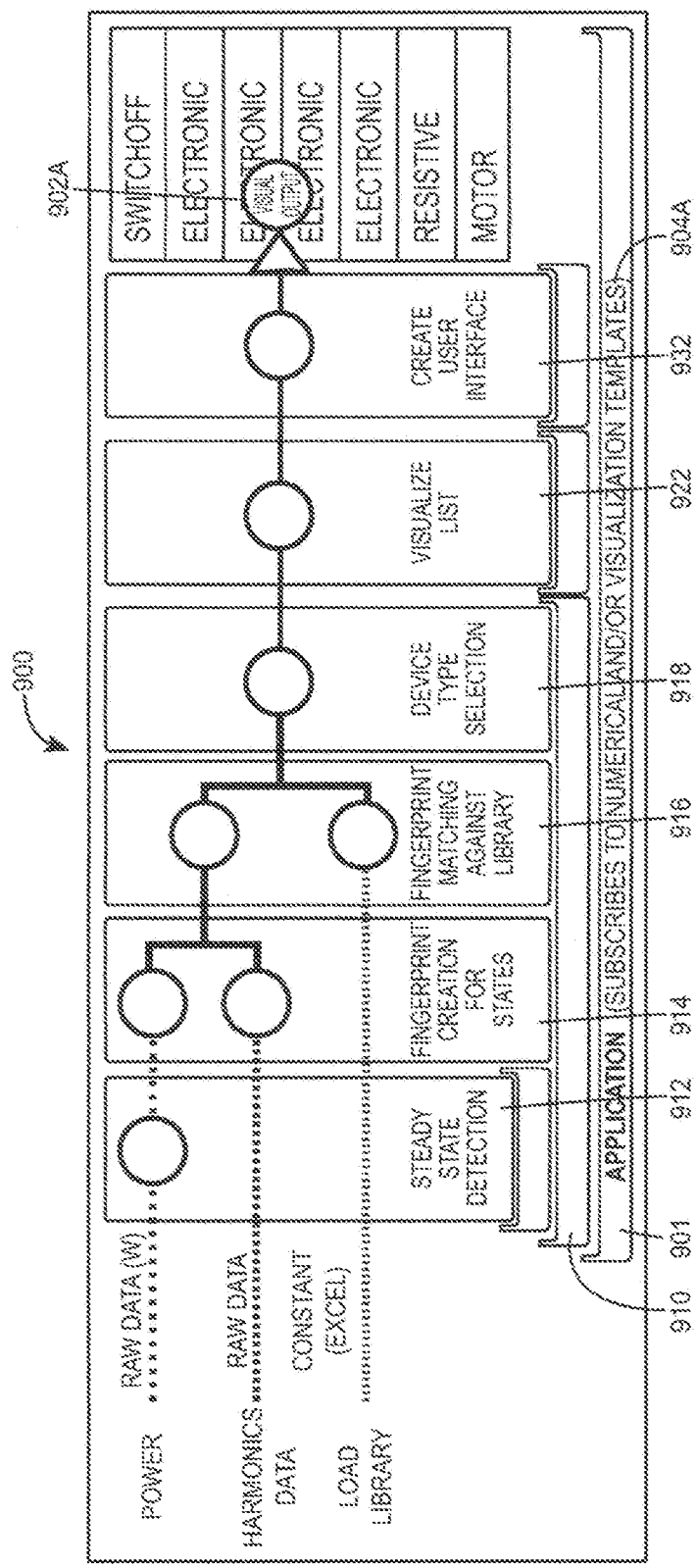
FIGS. 9A-9B illustrate exemplary template module architectures.
Figure 9B:
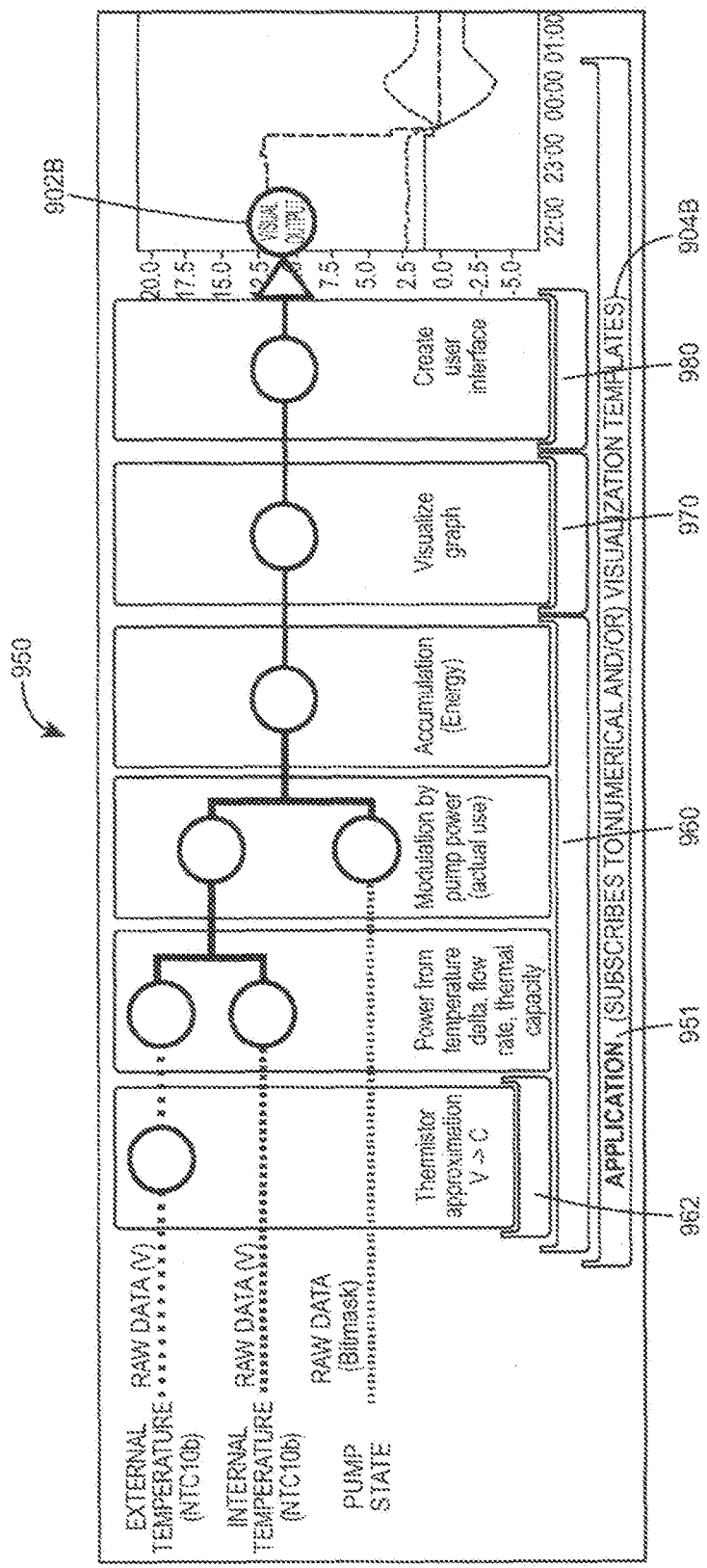

Each storage device 40 may store data on a disk and may store most recently added data on memory to avoid input/output bottlenecks. Additionally, each storage device 40 may store the energy usage data in a raw form. For example, the energy usage data may be stored as an integer number that represents an increasing pulse counter, which is the one of the rawest forms in which the energy data may be stored. For example, 10,000 pulses may be translated to 1 kilowatt-hour of energy. Another example may be storing raw data as a voltage value, for example from 0-10 volts or a current value, for example from 4-20 milliamps. Another example of raw data includes any one of the following: power data, harmonic data, external temperature, internal temperature, pump state, electron emissions from nuclear decay, information received from spectral analysis, raw radar data (e.g., speed, geospatial information from different radars), and amount of photons from a light detector, sound intensity from a audio sensor. FIGS. 9A and 9B illustrate how some raw data may be processed. Storing the energy usage data in a raw form may include the form that the data was received from the sensor device or a digital representation of that data. Storing the energy usage data in a raw form may enable the system 100 to more efficiently store and to later more effectively and efficiently present the energy usage data to a user. Storing the data in a raw form enables the energy usage data visualization method described below to interoperate effectively with customizable and flexible presentation operations. After the information has been placed into long-term storage, the storage unit may send an acknowledgement message back to the logger device 30.

In providing another explanation, FIG. 3 illustrates a method 300 that may be used to store the energy usage data in a storage device 40 of a plurality of storage devices, e.g., 40a-40f. A logger device 30 may transmit an energy usage measurement data message packet 600, which may include the origination information data 602, timestamp data 604, and the energy usage data 606, (block 302), to a long-term storage device 40. The logger device 30 may determine where to store the energy usage measurement data 606 based on the origination information (block 304), e.g., by applying a spreading algorithm to the origination information data. The results of the spreading algorithm may be used to choose which of a plurality of storage devices should be used to store the particular energy usage data.

As stated above, system 100 includes several sub-systems, such as an exemplary energy usage data storage distribution system 101, as illustrated in FIG. 1A; and an exemplary energy usage data monitoring and presentation system 102, as illustrated in FIG. 1B; and an exemplary distributed computing system 110, as illustrated in FIG. 1C. These systems include devices (or service modules) that are able to operate together to perform their respective functions because each device (or service module) that is part of the distributed computing system 110 may be made aware of the other devices (or service modules) in the system. One way the devices are made aware of the other devices is via a proprietary service announcement protocol.

Proprietary Service Announcement Protocol and Process

Figure 7:
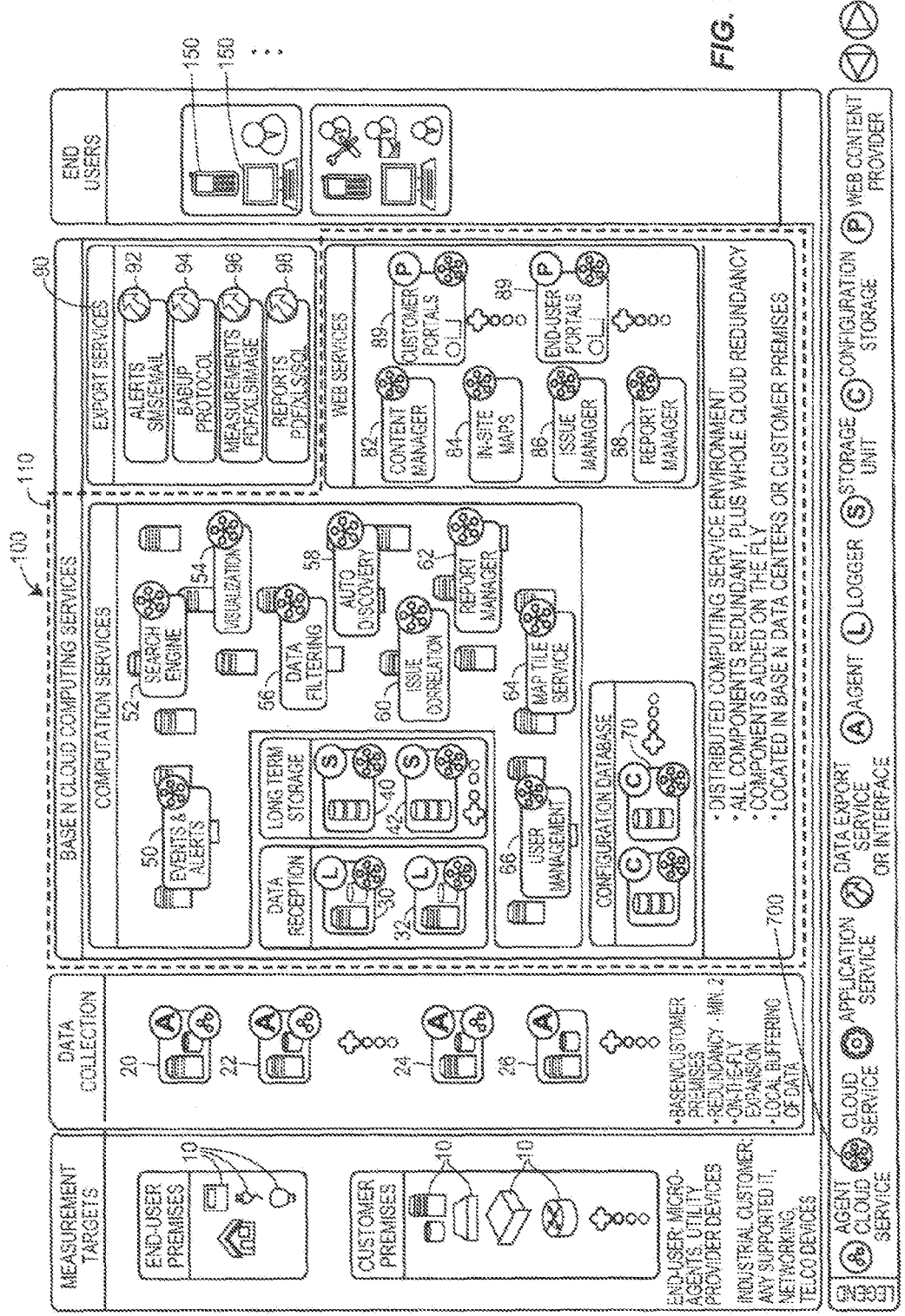
FIG. 7 illustrates an example system architecture that may support a distributed service discovery protocol process.

FIG. 7 illustrates a proprietary service announcement protocol process that may be used by the example distributed computing system 110. In particular, each service module that is indicated as having icon 700 (e.g., cloud/distributed service icon) identified with it is capable of communicating all or a part of the service announcement protocol described herein. The service announcement protocol may require that every existing service module of the example distributed computing system 110 send out announcement messages that describe which respective service it provides.

System 110 may have a distributed service discovery based architecture that may use devices that include off the shelf server hardware that, for example, runs on a LINUX operating system. Each physical computer/server may contain several logical service modules. The service modules may be redundant in the system 110. Each service module may have a corresponding redundant service module. Each of the other service modules in the system 100 may monitor for an announcement message that is transmitted by a service module that it may use later. Each of the other service modules may store the service information that it requires in order to perform its own service.

Existing routing protocols and established communications design concepts teach against the herein described service announcement protocol. In particular, existing routing protocols and established communications design concepts direct their packets by using the Internet protocol (IP) address information as a target destination between modules. In particular, each module of the background art stores the IP address information in a table or other storage method of IP addresses. Each module of the background art uses the table of IP addresses to determine where to route packets when wanting to transmit information (e.g., in the form of packets) across its system to a more distant target IPv6 address. Additionally, existing routing services maintain multiple different state-type information. Additionally, established communications design concepts are designed to minimize the inter-device communications to save bandwidth costs. An embodiment of the herein described service announcement protocol is contrary to these established routing design concepts.

For example, an embodiment of the service announcement protocol described herein may use service information to determine where to send or route data. Also, an embodiment of the service announcement protocol described herein may not rely on state information besides updating a list of active services at each service module. A module of the system 100 may use service information that it received from other modules of the system 100 to identify a target destination that includes service information for a service it requests. A service request may specify a particular service as a target destination. This service information may be used in routing decisions throughout the system 100 of FIG. 7, and may be more particularly used in the distributed computing system 110 that is highlighted in FIG. 7 and FIG. 1C.

As illustrated in the example protocol process of FIG. 7, each physical computer/server/device in the system 110 may run one or more services via a respective service module. In the case of a highly intensive input/output service, a service module may run only one service. In any case, system 110 may be described as a distributed computing service system. Each service module in the system 110 may announce at least one service capability. Each service module may announce its presence and its particular service capabilities by transmitting a corresponding service announcement message. For example, each service module with the cloud/distributed service icon 700 (FIG. 7) may transmit service announcement messages.

For example, a service announcement protocol that may be used with the system 100 includes any one or more from the following list of possible service announcement: agent service announcement, logger service announcement, storage unit announcement, event monitoring and alerting announcement, search engine announcement, visualization announcement, data filtering announcement, autodiscovery announcement, inventory announcement, issue correlation announcement, report manager announcement, user management announcement, map tile service announcement, content manager announcement, insite map announcement, issue manager announcement, report manager announcement, customer portal announcement, end-user portal announcement, data export service announcement, interface announcement. Each service module of system 110 may send a service announcement message.

Each physical computer/server (i.e., device) may store and execute one or more logical service modules. Each logical service module may have redundant instances at several different physical servers or devices throughout the distributed computing system 110. All the devices (including their service modules) of the distributed computing system 110 may transmit respective service announcement protocol messages. The other devices/service modules may not transmit announcement messages.

For example, the agent devices 20 may not participate in the announcement protocol, while the devices indicted by the icon 700 do participate. This may be because the agent 20 information may be maintained at a storage location associated with the customer environment. Thus, the agent 20 information may be not be maintained using the announcement protocol method 700. The agent devices 20 may have their configuration information stored anywhere else in the system 100. For example, the agent device configuration information may be accessed using the following:

Agent machine (configured):
- http://log1.basen.net:8080/Logger/
- http://log2.basen.net:8080/Logger/

The agent device 20 configuration information may be easily changed by a user or a central management device. The agent devices 20 may be directly configured with the information that indicates where the agent device 20 should transmit their data. In this way, the agent device 20 may be spared the burden and processing that is required to monitor and receive announcement messages. The agent device 20 may be configured to transmit the energy usage data it has received from a measurement device 10 to a particular primary 30 and backup logger device 32.

The logger device 30 is part of the distributed computing system 110. The logger device 30 may receive the energy usage information from the agent device 20 and may translate the energy usage information to a message format that is easily transferrable throughout the system 100.

Each of the logger devices 30 may additionally transmit the energy usage data to any service module. For example, a logger device 30 may transmit energy usage data to a log receiver service module 30a and/or a log sink service module 30b (not shown). The logger device 30 may monitor the energy usage data to determine whether to transfer the energy usage data to a log receiver service module 30a and/or a log sink service module 30b.

For example, if the logger device 30 receives energy usage data and determines that the data is a type of data that would trigger an event or alarm, then the logger device 30 transmits the energy usage data to a log sink service module 30b. The log sink service module may perform real-time analyses to determine how to provide an appropriate notification or presentation of the event or alarm.

If the logger device 30 determines that the energy usage data is to be permanently stored, then the logger device 30 may transmit the data to a log receiver service module 30a. The timing of the storage of the energy usage data may be very fast. For example, it usually takes less than 2 seconds for the energy usage data to be received by an agent device 20, and then processed by a logger device 30, and finally to be stored at a long-term storage unit 40.

A logger device 30 may send out announcement messages that may use a multicast or broadcast type message. The announcement message is used to announce its service capabilities. Other service modules of the system 100 may receive the announcement message. Other service modules of the system 100 may retrieve the service information from the message to store that information, so that it is available when the particular store service is required.

Figure 8:
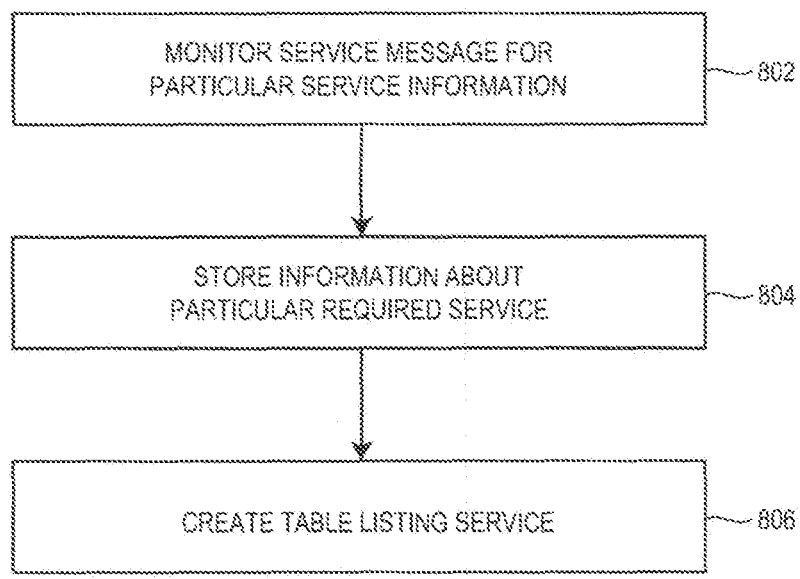
FIG. 8 illustrates a flow diagram of an exemplary service receiving procedure, which may be performed by each service module of the cloud/distributed computing system.

For example, FIG. 8 illustrates a service receiving procedure which may be performed by each service module of the system 110. Each service module may monitor the broadcast messages for a particular service which it requires (block 802). For example, a logger module 30 may monitor for long term storage announcements that are sent out by active long term storage modules 40. The logger module 30 may store service information in a table (e.g., Table 1) that may store a list of the available long term storage module services with their associated physical addresses (block 804). Each module of system 100 may create a table that lists all of the services that it requires. (block 806) Additionally, a table may include other information, such as a timestamp of the last received message that specifies how long the service has been valid, and a hop count value, as shown in the portion of an example table below. (block 806)

TABLE 1

Example service table used by a logger device 30

| Service | Physical address | Time value | Hop count |
|---|---|---|---|
| e..g., Long term storage module service 1 logreceiver | 87.108.201.193.4243 | 180000 | 1 (note: if same hop count then higher address is selected) |
| e..g., Long term storage module service 2 logreceiver | 46.183.72.32.4243 | 180000 | 2 |
| e..g., Distributed Image Generated (DIG) service | 46.183.72.32.4233 | 180000 | 1 |
| e..g., any Front End Publishing service where users log in | 46.183.72.34.80 | 90000 | 1 |

When the receiving service module determines that the monitored announcement message does contain useful information, the receiving service module may store that information (block 804). The information may be stored as a table or list that relates the required service with a logical physical address and a time value. The time value may be indicative of the time for or from which the service is considered valid by the system. The receiving service module may maintain the information it has stored by keeping information that it determines to be active based upon the received time value (block 806).

For example, a logger device may monitor for announcement messages that are of the type storage. The logger device may store any storage information it receives from the monitored storage type announcement messages. The logger device may receive energy usage data in real-time. The logger device may first determine when a storage service is required from the group of services in its table based on the service type. The logger device may determine which one or more of a group of available storage services to use based on a hop count and a group index value.

A service module may receive more than one service announcement message from a particular service. In order to determine which service out of many possible services to use, a service module may use hop count information to identify a preferred service. For example, a service module may use a more local, nearby, or lower hop count to identify a preferred service from other available services, which may have higher hop counts.

Additionally, other techniques, such as a straw program may route local packets across to another network by setting the edge of a network with a straw program that may increase the hop count when a packet moves from one network to another. For example, when the packet originates from a device, then the hop count of the transmitted message may be set to value of 0. When a packet is local, or on the same LAN, the packet may have its hop count set to a value of 1. If the packet moves to another system, and this passes a straw program, the straw program may increase the hop count of the message to 2. The straw programs may be used to prevent broadcast storms by not allowing packets with a hop count of 2 to be broadcast across another network or system.

Example announcement messages are described below. Generally announcement messages may include a timestamp (e.g., 08:11:02.266), a message type indicator (e.g., "Announce"), header information (e.g., 20010670008f05010000000000000424f82, which may be used for faster debugging and/or monitoring purposes).

An example announcement message from a logger device 30 is:

```
Logger:
08:11:02.266 ANNOUNCE 87.108.201.193.4243
20010670008f05010000000000000424f82 logger
    Service-URI=
    "rmi://:20358/20010670008f05010000000000000424f82"
    Service-Validity-Period=<I>180000
    Service-Sub-Type="primary"
    Logger-Target="http://87.108.201.193:8080/Logger/"
    Service-Version="5.2.3.201105041551-1.1358.0"
```

The logger device may have a respective logger service module 30 that may announce its service is of a logger type service. The logger type service may have a remote method invocation that is accessed via dynamic code loading with Java, such as a uniform resource identifier, e.g., rmi://:20358/20010670008f05010000000000000424M. This address may be used from service module to service module for inter-service functionality. The logger 30 announcement message may include information such as any one or more of the following: how long the service is valid, e.g., 180000 milliseconds (may indicate how long the service has been valid), whether the logger is acting as a primary or backup logger 30, the target information that may be the web address that the user needs to use, and which version of software it is running, e.g. Service Version.

A storage device/service module 40 may announce what service it provides with announcements messages such as the following:

```
Storage:
08:11:02.269 ANNOUNCE 87.108.201.193.4243
20010670008f05010000000000000424f8901 logreceiver
    Service-URI=
    "rmi://:20364/20010670008f05010000000000000424f8901"
    Service-Validity-Period=<I>180000
    Service-Sub-Type="primary"
    Service-Hash-Group-Index=<I>1
    Service-Version="5.2.3.201105041551-1.1358.0"
    Service-Hash-Group-Size=<I>1
08:14:31.857 ANNOUNCE 46.183.72.32.4243 2eb74820428c
logreceiver
    Service-URI="rmi://:17066/2eb74820428c"
    Service-Validity-Period=<I>180000
    Service-Sub-Type="E_12_5"
    Service-Hash-Group-Index=<I>5
    Service-Version="5.2.3-1.1358.0"
    Service-Hash-Group-Size=<I>12
```

The storage module may announce its service is of a log receiver type service. The storage announcement messages may contain a timestamp, a message type (e.g., ANNOUNCE), a physical IP address (e.g., 87.108.201.193.4243), a header (e.g., 20010670008f05010000000000000424f82 logger), a remote method invocation (e.g., Service-URI="rmi://:20358/20010670008f05010000000000000424f82"), a time for keep the information of the message as valid by the receiver (e.g., Service-Validity-Period=<I>180000), a primary or backup indication (e.g., Service-Sub-Type="primary"), which may be used to specify which service is critical or not with respect to alarm notifications, Logger-Target="http://87.108.201.193:8080/Logger/"), and software version information (e.g., Service-Version="5.2.3.201105041551-1.1358.0").

An announcement protocol message may be transmitted repeatedly, for example every 30 seconds. Each device/service module that receives an announcement message may store the announcement information in a table based on which services it requires. Also, as long as a device/service module receives continuous announcement messages for the particular service, the service module may maintain that service as an active service in its list of available services. For example, if a service module does not receive a message from another service module for 180 seconds, then that particular service module is removed from its list of active service modules. Such an active service module list may be kept at each physical device/logical service module.

Each device/service module may keep track of which services are currently available and where to send a request for a service based upon the announcement messages it has received and stored. For example, the receiving devices will receive a service announcement message and will store the information about the service, e.g., in a table that lists what service type is available, sub-type service information, and an address from where the service is being provided. Each service module may store additional attributes, such as the additional example information, which is specified in the example announcement messages described herein.

A service module of the system 110 may use the following method of updating their own communication table that may be used to store information about the services that they require or that are necessary for executing their own service. Each service may announce its availability with an announcement message; may remove a service from its communication table if no announcement message is received again for a pre-specified timeout time, e.g., 180 seconds; may denounce itself if it shuts itself down, e.g., send a denouncement type of message; and if after sending a request to a particular service that is active on its communication list, it does not get a response within a particular time, the service device may remove the non-responsive service form its communication list.

Other examples of announcement messages that may be announced by additional service modules of a logger device include the following respective logsinc and logquery announcement messages:

Real time:
08:18:36.220 ANNOUNCE 46.183.72.24.4243 2eb74818e32c logsink
   Service-URI="rmi://:58157/2eb74818e32c"
   Service-Validity-Period=<I>180000
   Service-Hash-Group-Index=<I>1
   Service-Version="5.2.3-1.1358.0"
   Service-Hash-Group-Size=<I>1

-continued

Retrieval:
08:14:32.306 ANNOUNCE 46.183.72.32.4243 2eb7482042a1 logquery
   Service-URI="rmi://:17060/2eb7482042a1"
   Service-Validity-Period=<I>180000
   Service-Sub-Type="C_12_5"
   Service-Hash-Group-Index=<I>5
   Times="20100101-20110225"
   Service-Version="5.2.3-1.1358.0"
   Service-Hash-Group-Size=<I>12

The respective logsinc and logquery announcement messages include similar fields as the other announcement messages described herein. The logsinc type service is used during real time energy usage data analysis to determine whether an user should be notified of an alert or error condition occurring in the system 100. The logquery type service is used when a user requests to view or get information about some energy usage data that was already stored.

Example Announcement Messages for Retrieving Data for Presentation to a User

FIG. 1B illustrates an exemplary energy usage data monitoring and presentation system 102. As described above, the energy usage data may be analyzed for alarms or events in real-time and may be stored for subsequent access and presentation by an exemplary energy usage data monitoring and presentation system 102.

For example, system 102 may include a search type service module which may be used to obtain energy usage data. An example of a search type service module includes a search service module 52 or auto discovery module 58, data filtering 56, issue correlation 60. An example of an announcement message from a search type service module is as follows:

Search service:
08:35:14.273 ANNOUNCE 46.183.72.26.4243 2eb7481a8cc604 search
   Service-URI="rmi://:36039/2eb7481a8cc604"
   Service-Validity-Period=<I>180000
   Service-Sub-Type="inventory"
   Service-Hash-Group-Index=<I>1
   Service-Version="5.2.3-1.1358.0"
   Service-Hash-Group-Size=<I>1
08:35:14.270 ANNOUNCE 46.183.72.26.4243 2eb7481a8cc602 inventory
   Service-URI="rmi://:36039/2eb7481a8cc602"
   Service-Validity-Period=<I>180000
   Service-Hash-Group-Index=<I>1
   Service-Version="5.2.3-1.1358.0"
   Service-Hash-Group-Size=<I>1
   Search sub types:
- Pages - page content
- Inventory/Autodiscovery - measured device inventory
- Alert/Issue - configured alerts
- Documentation
- Templates - what kinds of templates we have made A search type service module may search for a unique id (e.g., originator information 622, origination information 602 of FIG. 6) to obtain associated energy usage data or other data. For example, A user may submit a request for finding information about any variable of the system (e.g., all alarms associated with a logger device, etc.) by searching through stored separate inventory data. This data may also be stored in a long term storage device 40.

The second example of the search type service announcement message is from an example search service module 52, which is of an "Inventory" type. An inventory type search service module 52 may be used to obtain information about other devices and their particular configuration information. For example, an inventory search service module may be used to determine what type of server another service module uses, e.g., linux, or how many processors are on the server, e.g., eight, or which type of disks and interfaces the server may have, or what versions of software or hardware are currently in use, etc.

Another example of a search service module 52 may be of a "Pages" type. A pages type search service module may describe what page content may be provided. "Alerts" and "Issue" service modules may describe the data that may be used to indicate that an issue/event or alert situation has arisen. A "Documentation" type search service module may provide access to manual information and basic documentation on how things to work, and how to configure device, maintain, and operate the system, and basic user information. A "Templates" type search service module may describe how the data may be filtered using one or more filters or filter settings, and may provide further documentation to a user of the available filters so that the user can configure new types of inputs and algorithms to provide the end user with the desired output presentation. The above types of search service modules may be used by all user-interface service modules.

Another type of service module that may be part of system 102 includes a distributed image generator (DIG) service module (e.g., data filtering module) 56, which may be used to create a graph or other image presentation of the stored measurement data. A DIG service announcements may be as follows:

```
Distributed image generation (DIG):
  08:48:23.670 ANNOUNCE 46.183.72.34.4243 2eb74822424a dighttp
    Service-URI="http://46.183.72.34:16972/"
    Service-Validity-Period=<I>180000
    Service-Version="5.2.3-1.1358.0"
  08:48:23.765 ANNOUNCE 46.183.72.34.4243 2eb74822424a01 dig2
    Service-URI="rmi://:16971/2eb74822424a01"
    Service-Validity-Period=<I>180000
    Service-Version="5.2.3-1.1358.0"
```

System 102 also includes support services that may support the user interface visualization service modules. For example, a user map tile service module 64 may provide map information, including geographical coordinates, etc to a DIG service module 56. As described above, like the other service modules of system 110, a support service module, may also advertise its service across the system 110. A support service module like map tile service module 64, may transmit the following exemplary geographical location service announcement message:

```
Geo location services:
08:51:44.658 ANNOUNCE 46.183.72.26.4243 2eb7481a8ca6 geolocator
  Service-URI="rmi://:36008/2eb7481a8ca6"
  Service-Validity-Period=<I>180000
  Service-Sub-Type="default"
  Service-Version="5.2.3-1.1358.0"
```

Another example of the functionality of a geographical service module 64 is that it may also convert the name of a city or other address information into geographical coordinates so that the requested information may be provided with a map display. Any other service module may announce its service in a similar manner so that the other service modules are aware of its service and may implement its service if necessary.

As described above, the service modules may work together in a distributed fashion across the system 100. In this way, any service module may be redundant e.g., have an assigned primary and backup service module to provide system stability in case the primary service module fails, or they may be both used according to load balancing techniques.

Any group or all of the service modules may provide distributed processing throughout the system 100. For example, there may be two or more devices/service modules that are used to determine which events/alarms occurred, e.g., which threshold breaches occurred. These distributed services may be located on different devices, which may both receive the same measurement data and determine when a threshold is breached. Which device does further processing may be determined by communications that occur between the two devices. For example, the devices may transfer information about which device has been active the longest. The device that has been active the longest may be used as the primary service, and as such may be used to notify any export service module 90 when an alarm exists or it may open up an issue by sending information to issue manager module 86.

Logsinc service modules (not show in Figures as they may be dispersed throughout the modules of system 100) may be configured to receive all the energy data or may be configured to receive only energy measurement data that they may be set as being interested in. For example, a logsinc service module may be stored at device 50 and/or 58 and/or 52. This distribution allows for more copies of data to be kept locally for each service that may require the data. In this way, if the data needs to be searchable, then for example, the more current alarm information may be more easily accessed from the distributed local memory. Nonetheless, the data may still be maintained in a long term storage module 40. The data that may need more immediate access or that has been specified as more interesting or data that is commonly searched, such as event and alarm information data may be more quickly accessed by a user request for the data. A user may select the data he wants presented by use of a template creation procedure that is described in more detail in the discussion of FIGS. 9A and 9B.

For example, the alert correlation service 50 may receive information from a logsinc service module 30a (using "a" to denote where a longsinc service module may exist with another service module such as the logger service module 30) of a logger device 30 to receive all of the energy usage measurement data. As described above, a logsinc service announcement message may include the following message:

```
get measurements in (logger infra)
08:53:22.628 ANNOUNCE 46.183.72.31.4243 2eb74a034b1d logsink
  Service-URI="rmi://46.183.74.3:19232/2eb74a034b1d"
  Hop-Count=<I>2
  Service-Validity-Period=<I>180000
  Service-Hash-Group-Index=<I>1
  Service-Version="5.2.3-1.1358.0"
  Service-Hash-Group-Size=<I>1
```

The logsinc service module 30a may forward particular user specified measurements to determine whether an issue/event or alert exists. If an issue/event or alert exists, then the logsinc service module 30a may be used by an event/alert correlation service module 50. The event/alert correlation service module 50 may be used to determine which device or service of the network is not working properly. For example, when communications are not being received from a group of devices that have a topology wherein one device is closest to the event/alert correlation service, then the alert correlation service module 50 may identify the boundary device, if one exists, for the group of non-responding devices as being the root cause of the communications problem.

An issue/event and alert correlation service module (issue correlation) 60 may announce itself (e.g., send broadcast or multicast type messages to the other devices of the network) with the following example message:

```
alert correlation service:
09:00:40.099 ANNOUNCE 46.183.72.31.4243 2eb74a026a06 nissue
    Service-URI="rmi://46.183.74.2:27146/2eb74a026a06"
    Hop-Count=<I>2
    Service-Validity-Period=<I>180000
    Service-Hash-Group-Index=<I>1
    Service-Startup-Time=<L>1304436602874
    Service-Version="5.2.3-1.1358.0"
    Service-Hash-Group-Size=<I>1
```

The timestamp Service-Startup-Time=<L>1304436602874 may indicate, for example, the number of milliseconds from the 1st of January of 1970. This is the time the module has begun being active, this time is used to determine between several similar modules which module is to take an active role in using the calculations to produce a desired result, e.g., notify a user of the system 100 of an alarm by sending data to any one or more export service modules 90.

The issue/event and alert correlation service module 60 may correlate multiple different alerts or issues/events to notify a user where an issue exists. The notification may be presented to a user via a user interface service module 89. The correlation service module 60 may store the issue/event/alert information and its related determinations for access by a user. In addition, the correlation service module 60 may determine a root cause of a issue, and may export the event/alarm data by employing an export service module 90, such as notifications to other machines (e.g., SNMP traps, BABUP protocol messages, etc.) or to a user (e.g., via email, short message service (SMS), conversion to .pdf, XLS, and other image formats) or for providing any reports to a user, such as employing .pdf, XLS, or SQL presentation of the data.

Example Embodiments—Providing Data Visualization to a User

As illustrated in FIG. 1B, system 102 includes groups of service modules that may be grouped into the following services: e.g., computation services, configuration database services, export services 90, and web services 80. Each service group includes respective service modules that may be called on to present requested data to a user.

Figure 10A:
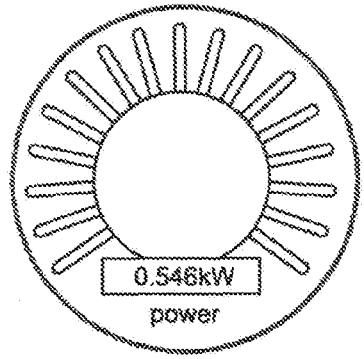
FIG. 10A to FIG. 10C illustrate some example interfaces, which may be generated by the exemplary energy usage data monitoring and presentation system of FIG. 1B.
Figure 10A:
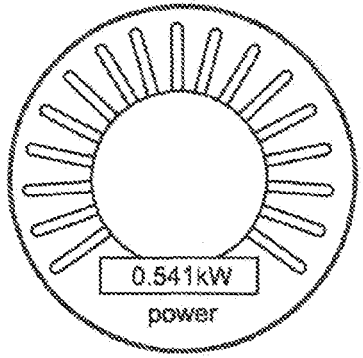
Figure 10A:
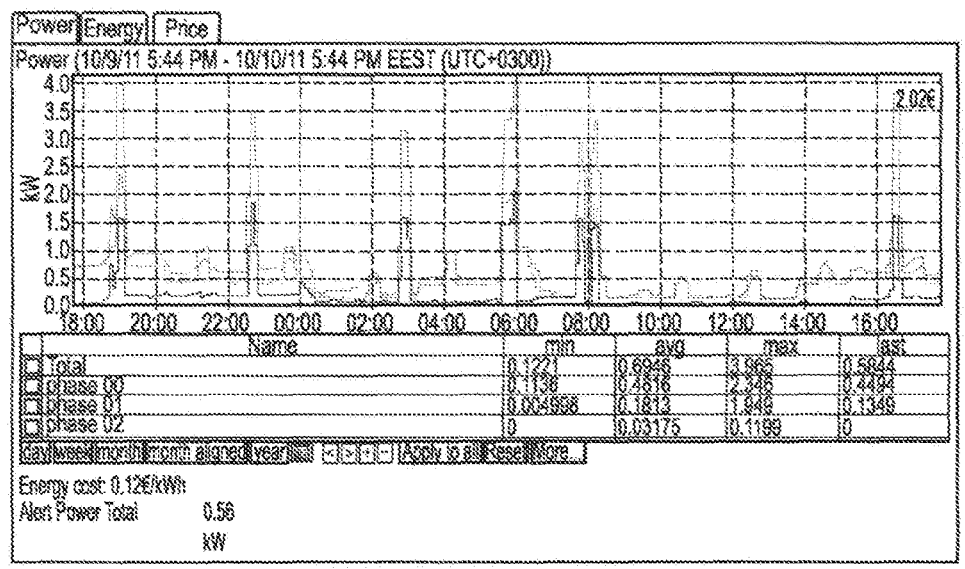
Figure 10B:
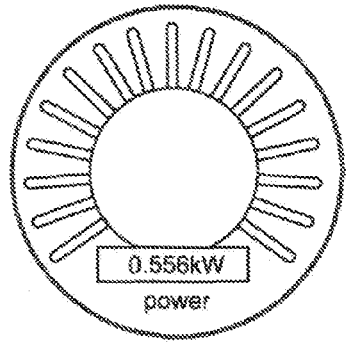
Figure 10B:
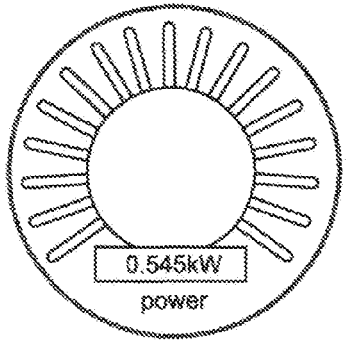
Figure 10B:
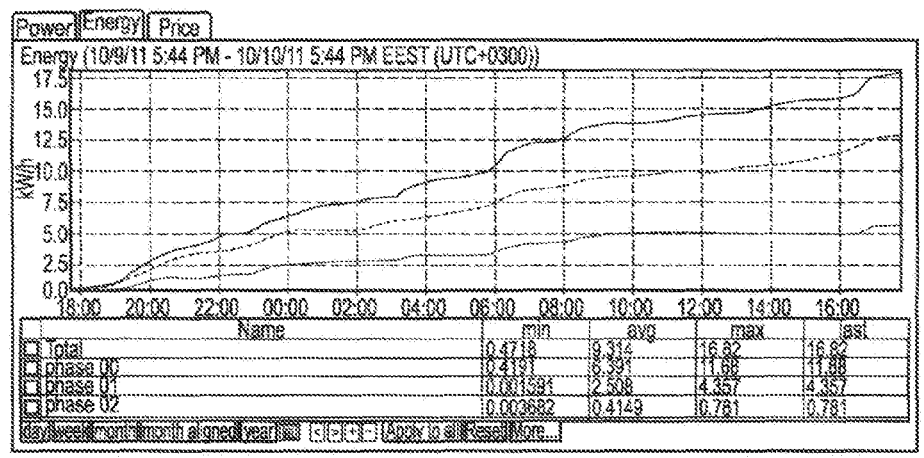
Figure 10C:
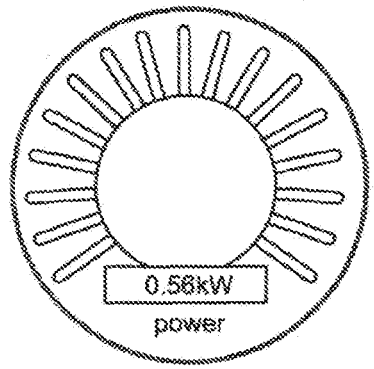
Figure 10C:
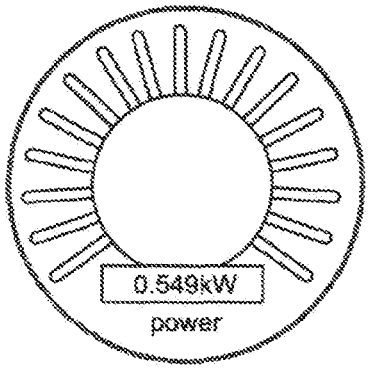
Figure 10C:
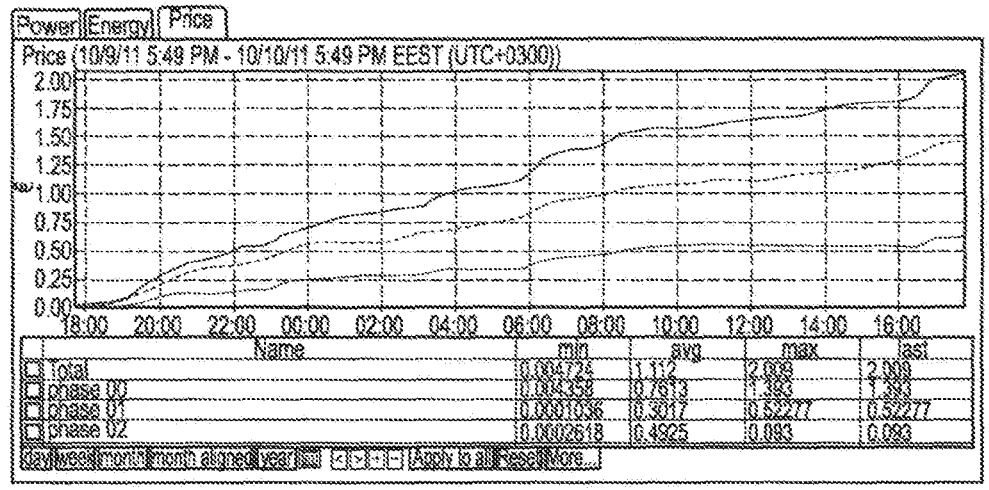

For example, a user may request data to be presented in any of the exemplary user interfaces illustrated in FIG. 10A-10C. FIG. 10A illustrates a user interface that provides a user with the amount of kW that were used during a time frame. Also, shown is the average power used during the last 5 minutes and the last 15 minutes. FIG. 10B illustrates a user interface that provides a user with the amount of kW/h that were used during a time frame. FIG. 10C illustrates a user interface that provides a user with information about the price of the energy used during a specified time frame. The energy usage data may be presented in additional alternative ways. Fr example a user may select a more specific time frame for which to calculate a running some. A user may create a box around the timeframe for which energy data is requested to be made visible. Any data may be presented that is based from the collected energy usage data. For example other user interfaces may show issue/event/alarm information, correlation information, load pattern identification, etc.

A user interface service module 89 (e.g., web content provider, customer portal, end-user portal, etc.) may enable a user to request any type of presentation of the energy usage data that was monitored and collected by the system 100. A user may interface with any type of user interface 150 to access a user interface service module 89. Examples of user interfaces include, a display, monitor, keypad, mouse, touch-screen device, etc. FIGS. 10A-10C illustrate a sample of the example user interfaces that may be presented upon a device 150.

Interface service module 89 is configured to process different types of service requests. For example, a user may request information about an event or alert that occurred within the system 100. A user interface service module 89 may present event/alert information by accessing the event/alert correlation service module 50.

For example, a web server service module 89 may receive and process requests, such as an HTTPS request. The web server service module 89 may find which service is providing HTTPS services by retrieving the following message:

```
09:04:43.263 ANNOUNCE 87.108.201.193.4243
20010670008f05010000000000000427b3b webpublishhttp
    Service-URI="http://87.108.201.193:31556/"
    Service-Validity-Period=<I>180000
    Webpublish-Portal="_admin"
    Service-Startup-Time=<L>1304671996351
    Webpublish-Portal-URL="https://beta.basen.com/"
    Service-Realm="tests"
    Service-Version="5.2.3.201105060844-1.1358.0"
```

The customer portal, such as a web server service module 89, may look up the portal URL from the received request and may forward the request based upon the information it has stored regarding the active services. The web portal service module 89 may then obtain the information it needs to forward a request for data visualization to a web publish service module, which may be another customer portal type 89.

The web publish service module 89 may also authenticate the user. The web publish service module 89 may also request assistance from other services to render the visualization properly. For example, the web publish service module 89 may enlist any of the follow services modules: image generation service module, inventory service module, search service module, or any other service module of system 100, etc.

InSite maps service module 84 is an example of a service module that uses almost all the service modules of the system 102 to present the user with the requested information. For example, the InSite service module 84 uses the configuration service module 70 to display all measured targets; uses an event and alert service module 50 to display current trouble spots; uses a search engine service module to search among displayed targets; uses a visualization service module 54 to generate graphs and other visuals for any target; uses an auto recovery/discovery service module 58 to locate any new targets or suggest adding new targets; uses a map tile service module 64 to place the data in a geographical context.

An example of how the stored raw energy usage data may be accessed by a user request includes: a user requesting a graph of the stored energy usage data. A web server service module 89 may access a visualization service module 54 that may request the desired data paths and time ranges from a long term storage device 40. The storage device 40 may retrieve the data and send to the visualization service module 54. The visualization service module 54 may then produce the requested visual graph for the specified portal of the web server service module 89. The web server service module 89 may provide the rendering to the client side user interface for an initial or an updated view.

A feature of the system 100 is that any required service module may be easily coded and integrated into the existing service availabilities so that the system 100 is easily scaled to include new service requests. The existing service requests and the possible customizable newly created service requests may be configured to present the requested data that is associated with the available energy measurement data in any way that the user requires.

One reason this is possible is because the system 100 stores the energy usage data in a raw data format.

Presenting Data with a Configurable Filter System that Accesses Raw Data

Illustrates an exemplary template module architecture 900 that may be used by a template module application 901 to initiate access of the raw energy usage data information that was stored by the smart grid system 100. A template module application 901 may be stored on a customer portal 89. For example, the template module architecture 900 of FIG. 9 may provide a structure that identifies a process that may be run by a template module application 901 to produce a particular visualization interface 902 (e.g., any visual output) of the energy usage data.

For example, a user of the system 100 may request a particular visualization output to be produced on the visualization interface 902. The visualization interface 902 may provide an interactive user interface to provide the user the means to request a particular visualization output. The visualization output may be produced using any of a preexisting energy data visualization template and/or a new user customizable energy data visualization template (e.g., 904). For example, a visualization template 904 may combine a particular set of numerical and/or visualization filters. For example, filters 910, 920, and 930 of FIG. 9A may be used to produce a template based upon by a particular user request.

For example, a user may call upon or subscribe to a customer portal service module 89, as illustrated in FIG. 1, via any type of end user hardware/software device. The application 901 may be stored at customer portal service module 89. The application 901 may execute a chain of filters, e.g. an analysis filter 910, a visualization filter 920, and an interface filter 930 that may enable the visualization interface 902 to generate a corresponding output.

Each filter may include lower level filters. For example, analysis filter 910 may include a steady state detection filter 912, a load fingerprint creation filter 914, and a load fingerprint matching filter 916. For example, visualization filter 920 may include a visualization list filter 922. For example, interface filter 930 may include a create user interface filter.

The system 100 is based on a configurable filter system that enables access to raw energy usage data. When a user makes a request for a particular visualization output of the energy usage data, an origination identifier (e.g., 622) of the request may be used to retrieve the associated energy usage data 606. The user request may also contain information indicating which visualization template 904 will be used to produce the requested output. The energy usage data information 606 may be fetched from a long term storage module 40 based on its origination identifier (e.g., 602 or 622). The energy usage data information 606 may be fed through a sequence of filters (e.g., 910-932). Each filter may perform a specific task. Examples of filter tasks include: transforming the data, aggregating the data, comparing the data, triggering based on the data, and producing a synopsis of the data, etc. A filter may perform any other transformation task or display presentation task.

FIG. 9B illustrates an example of a template 950 that includes a moderately complex filter chain. The filter chain includes a voltage-to-temperature filter 962 that may receive paired voltage readings. The voltage readings may have originated from an agent 20. The voltage-to-temperature filter 962 may transform the paired voltage readings into a temperature differential. Another filter 960 may take the temperature differential and other data, such as a flow rate and a thermal capacity, to generate a power value. Filter 960 may take the calculated power value and use a call state to determine an actual power usage. Filter 960 may take the actual power usage to produce an accumulated energy value. Filter 970 may use the accumulated energy value to produce a visual graph. Filter 980 may use the visual graph output to create the user interface 902B.

The example filter chains in FIGS. 9A and 9B illustrate the division of the computation tasks into subtasks (e.g., lower level filters). Subtasking the operations enables the system 100 to split user requests or queries into smaller subqueries. The subqueries may be executed in parallel to minimize computation time. In addition to subtasking in parallel, subtasking may also enable the system 100 to reuse filters or filter chains and their results as preexisting or readymade templates, such as template 900 or template 950.

Load fingerprinting is a service task or process that may be available to a user by the services of the system 100. Load fingerprinting is a term that describes how a user may be able to use the energy data along with current or previous analysis to determine which load is using the visualized energy output that a user may see on the visualization interface. Load fingerprinting may require reuse of a template, such as template 900, 950, or a similar template. The load fingerprinting task may be helpful to a user when a user wants to determine a way of reducing their energy consumption.

A user may trigger any of the services available in system 100. The services of system 100 may employ chains of analysis filters triggered by a user request or by a real time analysis system. The results may be fed to various visualization and/or export components of the system 100. To keep the user engaged, the services may start with simple information presentation and proceed to more complex applications. For example, initially, an application 901 may give the user a general overview of their household, and then may assist the user with achieving a more detailed understanding of the features of the application 901. In another example, an application 901 may present an administrator of a large system with a view of the system 100 and its information. The large system may have multiple components and energy usage data information as the larger system may be distributed over a larger geographical location. Applications of the system and its components are described in more detail below under the "Example Applications and Integration" section below.

The visualization template 904 may make produce a visualization output 904 that may be a part of a user interface, or an entire user interface, such as any part or whole of the example user interfaces illustrated in FIG. 10A to FIG. 10C.

For example, system 102 may obtain the energy usage data in a raw data form from a storage device 40, based on originator information 600 associated with the raw energy usage data to present the raw energy usage data based on filter settings. The raw data form may be the rawest digital form of the energy usage data.

Filter setting may include one or more configuration templates. Each configuration template may be obtained from a library of templates or may be created by a user providing customized settings. The filter setting may include one or more configuration templates including a measurement configuration template. The filter setting may also include one or more measurement configuration templates and one or more logic configuration templates. The filter setting may also include one or more logic configuration templates and one or more graph visualization templates. The filter setting may also include one or more graph visualization templates and one or more user-interface templates.

The exemplary template module architecture FIG. 9 illustrates a filtering process that may be used to measure the incoming and outgoing water temperature to determine the difference and then any energy gained from the heat pump. Providing more granular visibility into the actual efficiency and operation of a device may help u user determine is a problem exists with his energy devices.

Storing the measurement data as the rawest data possible enables the system 100 to easily implement additional mathematical analysis that may be required on the data. This enables the system to be easily scalable and more flexible. These calculations may occur in the distributed computing system 110 and thus enabling the monitoring devices to be of a simpler design. Storing the measurement data as the rawest data possible enables the system 100 to keep the amount of software that needs to be maintained at the monitoring devices to a minimum.

The described processes may be used for more general purposes, such as telecom network availability measurements, throughput, process time, latency, type measurements etc. The filter chain may be different, but may still be customized for particular user needs.

For example, a heat pump may produce two measurements, which may be a temperature measurement before the water is pumped through the earth, and a measurement of the amount of water going into the earth, and the temperature coming out of the earth. With this a temperature difference is calculated. And while the pump is running, the template may proceed to calculate how much energy was produced by the heat pump.

In any case, a user may edit the template algorithms and produce whatever visualization the user requires. Some existing templates are provided to a user in a library so that the user may combine the templates when configuring a new user-customizable template.

Example Applications for Integration with Above Disclosure

1. Case Study: Instrumenting a Zero Energy House

I. Introduction

A software-centric, hardware-neutral platform (e.g., FIGS. 1A-1D) may be used to provide the measurement and data processing services of the below sample case. Example primary design goals of the system 100 and its platform have been distributed computing and storage, fault tolerance, robust data transfer and retention, and flexible target site instrumentation.

The platform core (FIG. 1D) is a distributed computing environment containing numerous sub-services for receiving, processing, and presenting measurement information.

Redundancy at facility, hardware, and networking levels provides resiliency and scaling capacity, currently allowing hundreds of thousands of measured targets at a sub-minute resolution. A web-based user interface, configurable calculation engines, and templates—recipes for combining, processing, refining and presenting data—may adapt the service to end-user needs.

The fringe of the platform may consist of numerous sites— industrial facilities, data centers, or, in this case, the monitored household. Communication between core(s) and sites employs IPv6 over physical or wireless media.

Within a site, regular computers called agents collect raw data from instrumentation and aggregate it upstream to the core. Redundant agents are typically employed, and the units have capacity to cache the data in case of network outages. In the case of an industrial site, agents usually communicate directly with the monitored devices using common protocols.

Standardization and interfaces are only now emerging for Smart Grid monitoring, particularly where the Home Area Network is concerned. While waiting for standard protocols, in this case study an interim layer of monitoring equipment is employed to adapt to the instrumentation. Microagents are embedded computers with digital and analog inputs (and in some applications extra features such as GPS and mobile data). These units monitor actual physical sensor information, communicating results to the local agent either actively or when queried by the agent. In our case site, the number and price of the agents, microagents, and sensors are selected to reflect the budget of a single household: they consist of two agents, communicating via ethernet with networked monitored devices and with six microagents of different types, which in turn are connected to commodity sensor networks and simple physical sensors. The redundancy typical of industrial sites is not applied in this case—each agent unit covers its measurements alone.

The agent units can also control local equipment, either by automated decisions based on incoming monitored data or through user interaction in the core-side user interface.

Monitoring frequency is near real-time: depending on the application and the setup, targets are monitored from a rate of once per minute up to once per second. Agents deliver amassed data to the core about twice a minute.

A notable principle in this setup is that the end-user instrumentation can range from highly specialized sensors and controllers (such as those built into HVAC equipment) to very simple, low-cost commodity sensors. No intelligence need be built into sensor level equipment: the logic resides in the core, and multiple data feeds are combined there to produce aggregate data.

II. Instrumenting a Zero Energy House

As a model solution for implementing measurement and monitoring technology and infrastructure, we consider a family household incorporating several solutions for energy efficiency, tracking, and control, the eventual (but not yet realized) goal being a zero site energy house. The owner's interest—and investment—in measurement and energy technologies has factored in from the start; while our main interest is the piecewise realization of an energy aware household, certain basic considerations, such as efficient insulation and heated water and air circulation, must be planned before construction. Expanding from this basis, off-the-shelf electronics are used to observe standard house systems, and data is aggregated into an external service for complete coverage and analysis.

Building for Energy Awareness

Energy efficiency may start with an example structure such as the following example structure. The living building—a ca. 300 m2, 2.5 floor house—is built with insulating block elements (Siporex, 375 mm) above ground and thicker insulation below (Leca block, 350 mm, with 50 mm Styrofoam core). The roof is double insulated (Siporex block, 250 mm, and glass wool, 250 mm). All windows are quadruple vacuum pane elements, and all doorways consist of dual, foam-core doors. (This type of construction may seem exaggerated in more temperate regions, but in the relatively harsh Nordic climes, this is a fairly standard approach to sensible building.)

Under-floor heating is used to warm living spaces efficiently. Insulated piping, relatively cool water (40 C, compared to 80 C required by radiating water heaters), and in-structure construction minimizes energy losses from heat leaks, maximizes transfer efficiency, and is subjectively more comfortable for the residents than air heating elements. Thermostats are used to limit actual temperature in individual rooms. A smaller secondary pipe circulates hotter water for cooking and washing.

The house is ventilated through ducting, and the fan-driven system incorporates an active heat exchanger that collects heat from exiting warm air and uses it to heat incoming fresh air (or vice versa during the less common hot spells).

The 108 m2 utility structure employs the same heating and insulation solutions, with slightly thinner blocks (Siporex, 250 mm) allowed by the lower room temperature (15 C) and correspondingly smaller heat gradient.

Both structures are wired with dual electrical networks, one connected to the public grid, other powered by the in-house battery bank and associated producers. High-power devices are mostly connected to the former grid, low-power devices to the latter, and outlets in each room allow connecting consumer devices to either.

Finally, both structures are wired with physical copper pairs (4/room) and CAT-6 cabling (2/room). The extra copper, laid with the electrical wiring, facilitates instrumentation; the physical network is used for end-user network access in addition to monitoring service communications.

Example of Building for Monitoring

Except for the physical cabling, the measurement system has been implemented post-construction and gradually. The core of the monitoring solution is built around the installed physical cabling. The two agents communicate over ethernet with microagents, and microagents employ direct A/D or the site wide copper cabling to communicate with installed sensors and relays or actuators within the site. One agent is dedicated to the fairly complex water heater system (separate due to its physical location), the other is responsible for all microagent communication and measurements. For example, six microagents are employed: an embedded computer dedicated to a weather station, three ethernet/local bus gateways for most sensor polling, and two ethernet/AD I/O gateways for power readings and actuator control.

Finally, sensors consist of diverse components, some being built-in outputs and inputs of existing equipment (e.g. we can consider the PID control unit of the water heater a 'sensor' from our perspective), others involving off-the-shelf sensors (pulse counters, thermistors, various 1-Wire sensors). The extent of the copper cabling and the range of the local bus and protocol allow considerable latitude in sensor placing even with just the three gateways.

Sensors themselves may contain very little logic, and they are expected to be prone to interference and random or systematic errors, which can be calibrated in the platform core. This eliminates for most part the need for highly specialized, expensive instrumentation. The raw data from the sensors is received twice per minute by the responsible agent, and is relayed to the platform core once per minute. Templates in the platform play the key role: assigned templates calculate accurate temperature from thermistor outputs or energy consumption from pulse counters, combine the raw or processed data from several sensors into relevant figures (e.g. temperature deltas or price of consumed energy), and, finally, determine the presentation format of the data.

In 2011, the rough cost for the whole installation is about 2000€; for comparison, a proprietary system with similar measurement capabilities installed during construction costs about 5-6000€.

Energy Consumption

The main household energy sink in a cold climate is heating. As discussed above, insulation and heat retaining strategies have been employed to minimize heat losses, and warm water circulation is a remarkably efficient transport with negligible heat leak. Additionally, per room thermostats control warm water flow to individual rooms, allowing reducing the maximum 24 C in rooms where less suffices. The controller of the water heater provides its in-system temperature and pump status and speed (pulse counter), and provides on/off control of the water pump for remote or automated cutoff.

The next major energy sinks are large household electric devices. The heating elements of the common water boiler are, themselves, one such device: the resistors can be powered by the generator (2×9 kW) and grid electricity (2×4.5 kW), the peak heating power being too high for battery based operation. The controller of the unit provides its power consumption (and power source) as a measurement. Other high peak elements—kitchen stove and lighting—are connected to the public grid. S0 pulse output enabled meters on the switchboard measure immediate power consumption, one unit providing total consumption, and 5 monitoring major light elements directly.

The secondary electrical circuit usually runs lower power—refrigerator, freezer, microwave—and critical (IT infrastructure) equipment suited for battery discharge rates. The air circulation pump and sewage plant are also connected to this wiring, as is spare power (UPS) for computing equipment. The combined drain of this equipment is well within the capacity of local energy production, and running them off the secondary circuit allows for optimal energy use without outage risk for high peak power elements. The total power use of the secondary circuit is monitored at its separate switchboard through pulse counters, similarly to the grid monitoring above.

Energy Production, Storage, and Transfer

In addition to the public power grid—which is occasionally unreliable (fall storms) or of low quality (brownouts during exceedingly cold winter periods)—the household contains two electric power sources and three thermal power sources. Additionally, waste heat is harvested for reuse.

The primary energy source of the household may be a closed-loop geothermal well and ground source heat pump. Twin 120 m bores provide 13 kW, or nearly 95% of annual household heating requirements, directly to 24001 boiler reservoirs, ready for the heated water circuits. The built-in controller (Ouman 202S) provides indoor, outdoor, and boiler temperatures, pump status, and also controls for water heating and pump; the unit is managed by dedicated agent A1. Additionally, separate thermistors provide ground circuit in/out temperatures via agent A3.

A generator (Kohler 74 kW diesel/biodiesel) may replace grid power as required, providing household electricity (max. 38 kW), charging the battery bank (40×6 lead acid, 235 Ah, max. 4 kW), and, when necessary, boosting boiler heating (2×9 kW). The unit may also generate waste heat at the rate of about 20 kW when running; the heat may be used to warm the utility structure during cold weather, or simply ventilated outside during summer. It may be monitored through secondary effects (battery bank voltage, utility space temperature), and the power and starter are controlled remotely (A3/MOXA).

A wind generator may provide secondary, ecological power at about 5 kW on a windy day, with about 8 kW peaks in gusts. Wind patterns at the location are not stable, and the unit is thus may not be suitable for regular power generation. It may be used to charge the battery banks in windy conditions. The wind generator output may be measured with a simple voltage sensor (LinkHub/A3).

The hub of the thermal energy equipment may be the boiler/water reservoir (Akvaterm 2400), with layers providing hot (60 C) and warm (40 C) water for circulation. Input from the heat pump may be supplemented as necessary by electric coils (max. 2×9 kW directly from the public power grid, or 9 kW from the generator), by the high-efficiency furnace (Arimax 35, producing 20-50 kW from locally grown wood and household trash), or, on sunny days, by solar water heaters (4×4 m2, max ca. 16 kWh per day directly to boiler). In an optimal situation, wind and sun alone may suffice to heat the water. The furnace and solar panels may be monitored through secondary effects, and the heat pump controller may provide water circuit in/out temperatures and boiler pressure. The platform may control each water pump and boiler heating.

While the air circulation (Enervent LTR-6) is an energy sink, the air vented by the integrated heat exchange unit may be only 5 degrees warmer than outdoors, and the reused heat provides significant savings. In addition to room temperatures, the temperatures of circulating air and exit air from the unit may be measured.

Other Measurements and Controls

While not directly related to power production or use, a number of environmental and ambient signals are measured as well, providing additional data points when following systems functionality and correlating other sources. Some, such as the sewage plant temperature monitor, simply provide additional information of systems functionality, others, such as lighting, heating, and door status, approach home automation. Ambient information—temperature, humidity, and, in living areas, CO2 quantity—is collected in each room and living space (multiple sensors, e.g. iButtonLink MS-TH, MS-TL), and a separate weather station unit (Vaisala A1WXT) monitors outside temperature, humidity, rain intensity, and wind speed. This unit is connected to a dedicated microagent that communicates directly to the platform over mobile data.

Finally, the microagent digital and analog outputs operate a number of relays controlling e.g. the mains and secondary power circuit switches, generator power/start, battery charging, heating pump power, lighting, locks, and garage doors. As with measurements, the implementation is inexpensive, with microagents controlling commodity relays and the logic residing on the platform side.

III. Results

A Heterogeneous, Expandable, Scalable, Budgeted Solution

Disclosed herein is an example of monitoring and controlling a heterogeneous, expandable sensor network. It may be budgeted at household scale and avoid vendor dependencies or protocols. On a high level this may give a user flexibility in selecting cost-effective HVAC, automation, and monitoring solutions without vendor lock-in. At the instrumentation level it may allow a mixture of highly specialized or built-in sensors on one hand and expansive coverage, resilience, and redundancy with cost-effective sensor solutions on the other, as well as gradual expansion and replacements without concerns over obsolescence. For example, replacing a broken sensor with another model is possible, and simply requires selecting a new template (e.g. 900 and 950 of FIG. 9A and FIG. 9B) to process the raw data appropriately.

The site installation described herein is nowhere near maximum capacity. The agent hardware may easily accommodate hundreds or thousands more measurement targets. Given the building cabling, adding ethernet gateways (such as further digital/analog I/O gateway units) is trivial and practically unlimited (IPv6). The employed LinkHub devices may accommodate up to 30 sensors per port, and four ports (wires) per unit.

An identical setup may thus be easily scaled to an apartment building (although scales of economy may side on other wire/bus solutions in such cases). Furthermore, given experience in industrial application of the measurement platform, it is known that virtually unlimited numbers of this type of low-input site may be monitored (given physical data infrastructure).

Example Adaptable Logic

On the platform core side, the design choice may be to store raw data and apply template logic for processing and final presentation as a key for flexible instrumentation. This approach may also allow combining multiple data sources into an aggregate signal.

An example of a simpler template (e.g. simpler than example templates 900 and 950 of FIG. 9A and FIG. 9B) might simply list raw data as numbers, or, more usefully, present the measurements in graph format. An example of this is the ambient temperature and humidity or light level sensors, which provide results directly in SI units. Another example template may also map raw data channels to meaningful names, drop unnecessary information depending on purpose (e.g. error correction channels), and use platform resources to generate a graph application.

A more complex template may do numeric calculations and combine data from several sensors to provide calibrated or modulated results. FIG. 9B illustrates the concepts: each NTC10 sensor connected to the heat pump provides a (2-channel) raw value over the local bus protocol that must be scaled and combined correctly, and then run through the Steinhart-Hart equation to convert thermistor resistance to accurate temperature. To calculate heating expenses, we apply known pump speed and heat capacity to the delta of incoming and outgoing temperature to get power consumption. This figure is accumulated, but only when the pump is actually turned on.

This aggregation allows the refining of raw data into relevant signals that not only indicate immediate equipment functionality, but give the user immediate feedback of efficiency and costs and allow building summary views of key information. Combined with other platform features, such as threshold and trend alerts and messaging, the end user is also informed of noteworthy events or potential problems.

User Benefits

The case study residents have stated that readily available immediate and historical energy information has helped them spot inefficiencies and malfunctions, encouraged economical everyday usage patterns, and prompted improvements and adjustments to home automation. Particular examples include:

An unintentionally activated, unsignaled pump heating coil was not obvious, but the incongruence between temperature in/out and power graphs was clear to the viewer, and helped pinpoint the unnecessary expense.

Awareness of the economical impact of energy choices has increased; for example, preferring biomass heating to expensive electricity on cold days can easily save 10€ per day. Automated notifications triggered by heating power consumption act as reminders to switch heating source.

Figure 11:
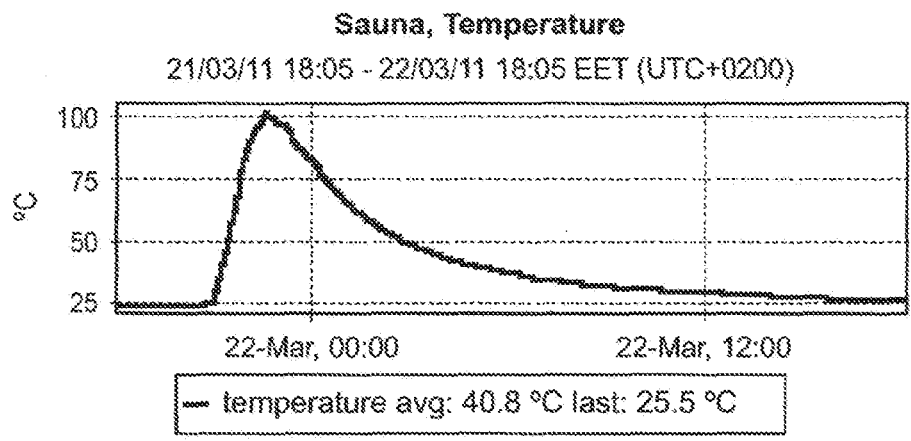
FIG. 11 illustrates another example interface, which may be generated by the exemplary energy usage data monitoring and presentation system of FIG. 1B.
Figure 11:
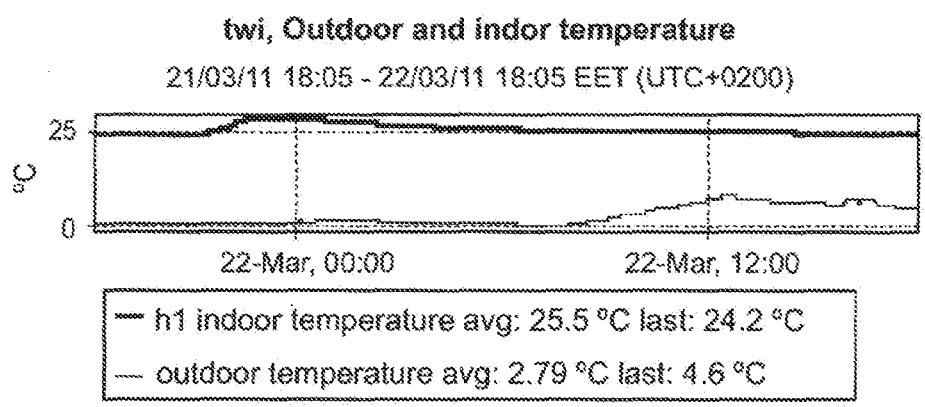
Figure 11:
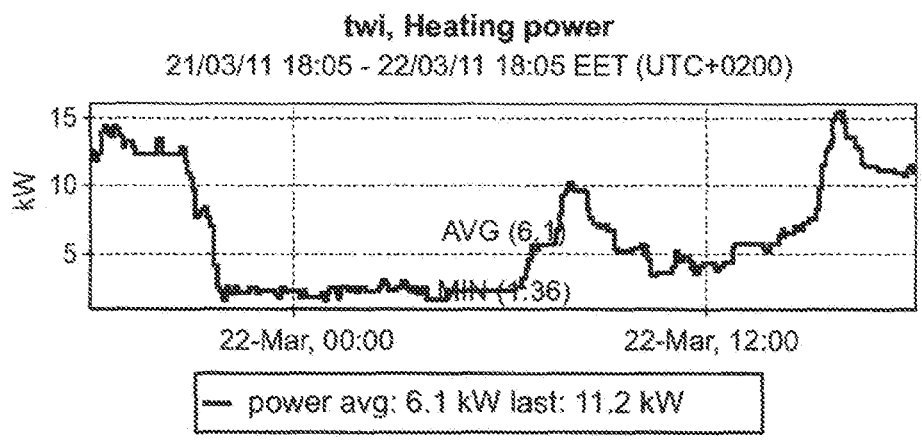

Awareness of the magnitude of waste heat has prompted more efficient utilization. Generator waste heat is used to boost utility space warming. Particularly interesting is sauna heating—the heating of a single room to 80-100 C for some hours would be quite wasteful, but with the heat exchange system, this energy can be redistributed back, heating the whole house for 10-12 hours without other sources (FIG. 11).

The greatest benefits have been achieved by being able to monitor and adjust HVAC, heat pump, solar panel, and other devices for optimal use, and being immediately aware of installation problems (e.g. inverted solar water pump), malfunctions or inefficiencies.

The system provides convenient household automation for controlling major energy consumers and producers remotely.

Relevance to the Grid

Unfortunately, energy administration and business practices in countries, such as Finland, make small scale and individual energy production impractical, and Finnish legislation is geared for large-scale operators. Were small-scale production encouraged, as required by EU mandate, the installation described here could be easily extended to allow energy output. With the scheduled addition of solar electricity, the installation could produce up to 35-40 kW for an annual output of ~25 MWh, mostly using the generator and biodiesel. Considering fuel logistics, this would not be a feasible full-time activity; however, during a power outage or brownout during storms and extreme cold, this energy could be used to balance local requirements.

Given more permissive energy policies, the capability to make complex, customized decisions based on instrumentation, ambient information, and third party services such as weather forecast or spot energy market services—just additional raw data from the platform's perspective—opens up interesting prospects both for optimizing energy use and coordinating production, as discussed below.

Considerations

The template system, while allowing considerable flexibility, may also produce quite complicated structures even at the scale of the sample installation. Keeping aware of applied templates and template sequences, of how raw data relates to final presentation, and of template dependencies, requires care and knowledge of the template logic. This is, fortunately, a platform software feature issue, and usability solutions are one of the current goals of platform development.

The template system also may allow trivial replacement of commodity sensors. However, if the characteristics of the new sensor require modified template logic, a discontinuity results: pre-replacement raw data would be processed with the new, invalid template. One partial solution to this would be an operational guideline of assigning new data paths to new sensors; a non-trivial solution involves supporting time dependent templates.

The actuator and control systems employed in the sample case are implemented as a prototype. The interaction system currently supports user initiated actions, and may be connected to triggers based on measurements, and thus automated responses (e.g. high wind—switch wind generator charging on). This may be accomplished by adding protocol-level support for platform-to-agent communications and templatable agent-side actions.

The current microagent-to-sensor polling frequency, 2/min, is suitable for most measurements, but in the case of the wind generator it may be insufficient: in gusty winds, the sampling frequency causes wind power to be underreported. A better strategy would be to poll the associated sensor at 1/s frequency and compose a batch result once a minute. Integrating this solution with the above-mentioned bidirectional capability may provide a better tool set.

IV. Future Work

The single most important ongoing development in the system is extending the template concept to the agent level. Full bidirectional communication between platform core and agent is possible, and may provide the platform for interactive tasks triggered by a user, repeating configured tasks, and reactive tasks triggered by measurements and conditions. The library-derived and customizable tasks are run by the agent units, which communicate with their local microagent community, effecting actions or producing on-demand measurements.

The expansion may combine disparate measurements—both local instrumentation and ambient sensors and external services—to make complex decisions for optimizing energy usage and production. Some sample scenarios include:

Coordinating with weather services, a dropping temperature trend should drive automated pre-emptive stocking up on cheaper night electricity and preference for own production; later, as spot prices peak, the system should automatically switch to production mode and benefit of the market.

Predicted windy weather indicates that battery powered energy should be preferred, and the freed capacity filled when winds arrive. As wind approaches storm levels, the generator should be turned off for safety, and the occupant informed by text message to prepare the premises.

Ambient measurements connect naturally to home automation. For example, given that the $CO_2$ readings of designated bedrooms have reached a plateau and other rooms dropped (and hypothetical motion sensors indicate restful behavior, and the time is late), a signal to switch off lighting should be given. Higher resolution monitoring (see below) could even accommodate immediate decisions based on room activity.

The progress of the case study house toward the zero energy goal continues, with the next expansion being 4 kW photovoltaic panels and related instrumentation. The target is to sustain the backup power system batteries without the grid, with renewables only. Other future installations include an oil and gas burner attached to the primary furnace and burning shared biodiesel with the generator set or accumulated biogas from the sewage treatment plant.

Some of the more complex modern power meters may provide much more information than simple pulse count. Load characteristics and other details may be used to distinguish individual unique events even from a single household level device by feeding high-frequency measurements through fingerprinting logic. The resulting data is treated as virtual measurements, and may be connected to decision and messaging logic just as any other data source. Fingerprinting with template logic is beneficial. The required measurement frequency, computing and I/O resources of fingerprinting are perfectly feasible, but the device-specific feature recognition and teaching aspects are factors for fingerprinting to be provided as a platform service.

Usability and productization for various user groups (end user, provider technical staff, etc.), both by providing ready-made template libraries and deployment helpers for known hardware and by simplifying custom templating, are an included as an ever-ongoing project. Part of this system scalability is the collection of a comprehensive template library suited for application to common microagent and sensor set-ups. While the templates for this system may be mostly customized, experience and models for several dozens sensors may be accumulated within the scope of the system capabilities, and based on experience with industrial measurements, library support for thousands more may be added as use cases arise.

What is claimed is:

1. An energy usage data storage system for storing energy usage data for later retrieval comprising:
   a first sensor device comprising a first processor programmed to receive electrical input and convert the electrical input to energy usage data, the first sensor device comprising a communication interface, the processor programmed to transmit the energy usage data to a plurality of redundant agent devices;

the plurality of redundant agent devices each comprising a second processor programmed to receive the energy usage data from the first sensor device and to transfer the energy usage data to a plurality of redundant logger devices;

each of the redundant agent devices programmed to establish origination information data which is indicative of the first sensor device that transmitted the energy usage data, wherein the origination information data is part of an energy usage data packet;

each of the redundant agent devices programmed to transmit the energy usage data along with the origination information data in the energy usage data packet to a logger device of the plurality of redundant logger devices;

the plurality of redundant logger devices each comprising a third processor programmed to determine to which plurality of redundant storage devices of a group of storage devices to send the energy usage data, wherein each storage device comprises a non-removable memory; and the plurality of redundant storage devices each comprising a fourth processor programmed to store the energy usage data as raw data for later retrieval and presentation on an end user interface device.

2. The energy usage data storage system of claim 1, wherein:
each of the plurality of redundant logger devices transfers the energy usage data to at least one storage device in real-time as the energy usage data becomes available.

3. The energy usage data storage system of claim 1, wherein:
at least one logger device transfers the energy usage data from a receiver of the logger device to a memory of at least one storage device in real-time when the energy usage data becomes available to the at least one logger device.

4. The energy usage data storage system of claim 1, wherein:
each of the plurality of redundant logger devices transfers the energy usage data to at least one storage device in real-time when the energy usage data becomes available to each of the plurality of redundant logger devices.

5. The energy usage data storage system of claim 1, further comprising:
a plurality of redundant and distributed service software modules each housed by a hardware device, each service software module being either a primary or a redundant service software module with respect to another service software module.

6. The energy usage data storage system of claim 1, further comprising:
a plurality of redundant and distributed service software modules each housed by a hardware device, each service software module being either a primary or a redundant service software module with respect to each other service software module;
wherein the primary and the redundant service software modules are each configured to execute a same or similar service functionality module at a different logger device or storage device.

7. The energy usage data storage system of claim 1, further comprising:
a plurality of redundant and distributed service software modules each housed by a hardware device, each service software module being either a primary or a redundant service software module with respect to another service software module;
wherein the primary and the redundant service software modules are each configured to execute a similar service functionality at a different logger device and at a different storage device.

8. The energy usage data storage system of claim 1, further comprising:
a plurality of redundant and distributed service software modules each housed by a hardware device, each service software module being either a primary or a redundant service software module;
wherein the primary and the redundant service software modules are each configured to execute a similar service functionality at a different logger device or storage device; and
wherein the first sensor device sends energy usage data at least two times per minute to each agent device.

9. The energy usage data storage system of claim 1, further comprising:
a plurality of template modules each housed by a hardware device configured to be programmed into customized modules configured to process the raw data during real-time operation of the energy monitoring system.

10. The energy usage data storage system of claim 1, further comprising:
a plurality of template modules each housed by a hardware device configured to be customized and graphically programmed via a user interface module into a customized module configured to process the stored energy usage data or present information about the stored energy usage data, during real-time operation of the energy monitoring system.

11. The energy usage data storage system according to claim 1, wherein:
the energy usage data comprises a carbon dioxide ($CO_2$) measurement.

12. The energy usage data storage system according to claim 1, wherein:
the energy usage data comprises appliance energy consumption.

13. A method of storing energy usage data in real time for later retrieval and presentation on an end user interface device, the method comprising:
obtaining raw energy usage data with a first sensor device comprising a first processor programmed to receive electrical input and convert the electrical input to raw energy usage data;
transmitting by the first sensor device raw energy usage data to a plurality of redundant agent devices when the energy usage data becomes available in real-time;
receiving the raw energy usage data from the first sensor device by a second processor of each of the redundant agent devices;
transferring by the agent devices the raw energy usage data to a plurality of redundant logger devices, each logger device comprising a third processor programmed to determine to which plurality of redundant storage devices of a group of storage devices to send the raw energy usage data, wherein each storage device comprises a non-removable memory;

transferring by the redundant logger devices the raw energy usage data to a plurality of redundant storage devices each comprising a fourth processor; and storing at the redundant storage devices the raw energy usage data as raw data in a form that the data was received from the first sensor device, wherein:

each of the redundant agent devices is programmed to establish origination information data which is indicative of the first sensor device that transmitted the energy usage data, wherein the origination information data is part of an energy usage data packet; and each of the redundant agent devices is programmed to transmit the raw energy usage data along with the origination information data in the energy usage data packet to a logger device of the plurality of redundant logger devices.

14. The method of claim 13, wherein:
the plurality of redundant logger devices transfer the energy usage data to at least one storage device in real-time as the energy usage data becomes available.

15. The method of claim 13, wherein:
at least one logger device transfers the energy usage data from a receiver of the logger device to a memory of at least one storage device in real-time when the energy usage data becomes available to the at least one logger device.

16. The method of claim 13, wherein:
the plurality of redundant logger devices transfer the energy usage data to at least one storage device in real-time; and wherein
real-time includes when the time to process the energy usage data from the receiver of the logger device to the storage space is at least the time at which the energy usage data becomes available.

17. The method of claim 13, wherein:
the plurality of logger devices and the plurality of storage devices are redundant and distributed service software modules, each service software module being either a primary or a redundant service software module with respect to another service software module.

18. The method of claim 13, wherein:
the plurality of logger devices and the plurality of storage devices are redundant and distributed service software modules, each service software module being either a primary or a redundant service software module with respect to each other service software module; and wherein the primary and the redundant service software modules are each configured to execute a same or similar service functionality module at a different logger device or storage device.

19. The method of claim 13, wherein:
the plurality of logger devices and the plurality of storage devices are redundant and distributed service software modules, each service software module being either a primary or a redundant service software module with respect to another service software module; and wherein the primary and the redundant service software modules are each configured to execute a similar service functionality at a different logger device and at a different storage device.

20. The method of claim 13, wherein:
the plurality of logger devices and the plurality of storage devices are redundant and distributed service software modules, each service software module being either a primary or a redundant service software module;

wherein the primary and the redundant service software modules are each configured to execute a similar service functionality at a different logger device or storage device; and wherein the first sensor device sends energy usage data at least two times per minute to each agent device.

21. The method of claim 13, further comprising:
processing the raw data during real-time operation of the energy monitoring system using a plurality of template modules configured to be programmed into customized modules.

22. The method of claim 13, further comprising:
processing the stored energy usage data, during real-time operation of the energy monitoring system, using a plurality of template modules configured to be customized and graphically programmed via a user interface module; and presenting information about the stored energy usage data, during real-time operation of the energy monitoring system, using the plurality of template modules.

23. The method of claim 13, wherein:
the energy usage data comprises a carbon dioxide ($CO_2$) measurement.

24. The method of claim 13, wherein:
the energy usage data comprises appliance energy consumption.

* * * * *